United States Patent
Kuroda et al.

(10) Patent No.: US 7,595,544 B2
(45) Date of Patent: Sep. 29, 2009

(54) SEMICONDUCTOR DEVICE AND MANUFACTURING METHOD THEREOF

(75) Inventors: Masayuki Kuroda, Osaka (JP); Hidetoshi Ishida, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 138 days.

(21) Appl. No.: 11/382,994

(22) Filed: May 12, 2006

(65) Prior Publication Data

US 2006/0261371 A1 Nov. 23, 2006

(30) Foreign Application Priority Data

May 19, 2005 (JP) ............................. 2005-146265

(51) Int. Cl.
*H01L 29/04* (2006.01)

(52) U.S. Cl. .................. 257/627; 257/190; 257/192; 257/194; 257/628; 257/E29.188; 257/E29.246; 257/E29.249; 438/285; 438/590

(58) Field of Classification Search ........................ None
See application file for complete search history.

(56) References Cited

U.S. PATENT DOCUMENTS

| 5,604,763 | A | | 2/1997 | Kato et al. | |
|---|---|---|---|---|---|
| 5,620,745 | A | | 4/1997 | Simpson | |
| 5,821,568 | A | * | 10/1998 | Morita et al. | 257/94 |
| 5,874,747 | A | * | 2/1999 | Redwing et al. | 257/77 |
| 6,156,581 | A | * | 12/2000 | Vaudo et al. | 438/22 |
| 6,465,814 | B2 | * | 10/2002 | Kasahara et al. | 257/192 |
| 2003/0082860 | A1 | * | 5/2003 | Yoshida et al. | 438/184 |
| 2003/0151064 | A1 | * | 8/2003 | Ohno et al. | 257/192 |
| 2003/0198837 | A1 | * | 10/2003 | Craven et al. | 428/698 |
| 2005/0218414 | A1 | * | 10/2005 | Ueda et al. | 257/94 |
| 2005/0242357 | A1 | * | 11/2005 | Uematsu et al. | 257/94 |
| 2006/0175618 | A1 | | 8/2006 | Ishida | |

FOREIGN PATENT DOCUMENTS

| JP | 04-323880 | 11/1992 |
|---|---|---|
| JP | 07-297495 | 11/1995 |
| JP | 09-169596 | 6/1997 |
| JP | 10-275955 | 10/1998 |
| JP | 2000-216497 | 8/2000 |
| JP | 2001-160656 | 6/2001 |

OTHER PUBLICATIONS

English language Abstract of JP 09-169596.

(Continued)

*Primary Examiner*—Minh-Loan T Tran
*Assistant Examiner*—Leslie Pilar Cruz
(74) *Attorney, Agent, or Firm*—Greenblum & Bernstein, P.L.C.

(57) ABSTRACT

An object of the present invention is to provide a semiconductor device and a manufacturing method thereof which can realize a normally-off field-effect transistor made of a III group nitride semiconductor. The present invention includes: placing a sapphire substrate in a crystal growth chamber; forming a low-temperature GaN buffer layer made of GaN as the III group nitride semiconductor, on a main surface of the sapphire substrate by a MOCVD method; and forming a GaN layer on the low-temperature GaN buffer layer by the MOCVD method. Here, a [11-20] axis of the GaN layer is perpendicular to the main surface of the sapphire substrate.

19 Claims, 18 Drawing Sheets

OTHER PUBLICATIONS

English language Abstract of JP 2000-216497.
English language Abstract of JP 2001-160656.
English language Abstract of JP 07-297495.
English language Abstract of JP 10-275955.
English language Abstract of JP 04-323880.
Murata et al., "Source resistance reduction of AlGaN/GaN HFET using novel superlattice cap later," Solid State Devices and Materials pp. 261-262 (2004).

* cited by examiner

PRIOR ART

Ga-face

● Ga atom
○ N atom

[0001]
[10-10]
[11-20]

● Ga atom
○ N atom

[11-20]
[0001]
[1-100]

SEMICONDUCTOR DEVICE AND MANUFACTURING METHOD THEREOF

BACKGROUND OF THE INVENTION (1) Field of the Invention

The present invention relates to a semiconductor device and a manufacturing method thereof, and more particularly to an electronic device such as a power transistor having a high breakdown voltage, or a light emitting device such as a light emitting diode and a semiconductor laser device.

(2) Description of the Related Art

A power transistor having a high output and a high breakdown voltage has been widely used in high-output power supply circuits, automobile parts, and the like, and lower losses and higher breakdown voltage have been desired in the power transistor. Currently, a transistor which is commonly and widely used is a power metal-oxide-semiconductor (MOS) field-effect transistor using a silicon semiconductor. However, in order to further reduce on-resistance and realize a higher breakdown voltage, it is thought that a new material, which is typified by a wide-gap semiconductor such as a silicon carbide (SiC) or a gallium nitride (GaN), needs to be applied to the power transistor.

Among these new materials, the GaN-based compound semiconductor has a high saturated drift velocity, which makes it possible to realize a so-called high electron mobility transistor (HEMT) which generates two-dimensional electron gas in, for example, a heterojunction of aluminum gallium nitride (AlGaN) and GaN (hereinafter, referred to as a AlGaN/GaN heterojunction), so that the GaN-based compound semiconductor is expected as a material for realizing further reduced on-resistance. Research and development for a power transistor having a high output and a high breakdown voltage and including this GaN-based compound semiconductor are currently being conducted vigorously, which is disclosed in "Solid State Devices and Materials", T. Murata et al., 2004, pp 261-262 (hereinafter, referred to as non-patent document 1), for example.

FIG. 1 is a cross-sectional view showing a structure of the conventional HEMT including the GaN-based compound semiconductor.

In this HEMT, on C-plane ((0001) plane) of a sapphire substrate 100, stacked sequentially are: an aluminium nitride (AlN) buffer layer 101; an undoped GaN channel layer 102; and an n-type doped AlGaN electron supplying layer 103. On the n-type doped AlGaN electron supplying layer 103, formed are: a gate electrode 104; a source electrode 105; and a drain electrode 106.

When, as the above-described HEMT, a device is manufactured using a GaN-based compound semiconductor, the GaN-based compound semiconductor is generally formed on a substrate having a plane direction of C-plane. However, if the GaN-based compound semiconductor is formed on the C-plane, a strong internal electric field is generated inside the GaN-based compound semiconductor, due to spontaneous polarization and piezoelectric polarization. As a result, in the above-described AlGaN/GaN HEMT for example, even in an undoped state, electric charge having a density of about $10^{13}$ cm$^{-2}$ is generated in an AlGaN/GaN heterojunction. Therefore, the power transistor having a high output and a high breakdown voltage and including the GaN-based compound semiconductor, which has been researched, is a so-called normally-on field-effect transistor in which drain current flows when a gate voltage is 0 V.

Note that forming of a GaN-based compound semiconductor on a substrate having other plane directions except the C-plane is described in Japanese Patent Application Laid-Open No. 2001-160656, Japanese Patent Application Laid-Open No. 4-323880, Japanese Patent Application Laid-Open No. 10-275955, and Japanese Patent Application Laid-Open No. 7-297495, for example.

SUMMARY OF THE INVENTION

In the meantime, the silicon power MOS field-effect transistor, which is currently widely used, is a so-called normally-off field-effect transistor in which current does not flow when a gate voltage is 0 V. On the other hand, the conventional field-effect transistor including GaN-based compound semiconductor is a normally-on field-effect transistor. Therefore, when a circuit has the field-effect transistor including GaN-based compound semiconductor, there are problems, for example, a problem that the circuit is damaged when power supply is cut off, so that utilization of such field-effect transistor is difficult.

The reason why this field-effect transistor using GaN-based compound semiconductor becomes normally-on type is that, when on C-plane of a substrate, semiconductor layer made of a GaN-based compound semiconductor is formed, and then on a main surface of the semiconductor layer, a gate electrode is formed, the main surface of the formed semiconductor layer becomes a polar surface, so that a polarized electric field is generated in a transistor depth direction which is perpendicular to the polar surface, in other words, in a direction of applying a gate voltage.

In the case of the technology described in the above non-patent reference 1, a main surface of GaN layer formed on a substrate has polarity, so that a resulting field-effect transistor becomes normally-on type.

In view of the above problems, an object of the present invention is to provide a semiconductor device and a manufacturing method thereof which can realize a normally-off field-effect transistor including a III group nitride semiconductor.

Note that hereinafter a plane direction is indicated using a symbol of minus, for example indicated as (11-20), where the minus represents a so-called "bar". For example, (11-20) means (11$\bar{2}$0)

Note also that an axial direction is indicated in the similar manner to the plane direction using a symbol of minus. For example, [11-20] means

[11$\underline{2}$0]

In order to solve the above problems, a nitride semiconductor epitaxial substrate and a manufacturing method thereof according to the present invention have the following structure.

More specifically, the semiconductor device according to the present invention includes: a substrate; a semiconductor layer which is on a main surface of the substrate, and made of a III group nitride semiconductor, wherein a [11-20] axis of the semiconductor layer is substantially perpendicular to the main surface of the substrate. Here, the substrate is a sapphire substrate.

In the case of an A-axial oriented III group nitride semiconductor, polarization is not generated in a direction parallel to the [11-20] axis, in other words, in a growth direction from the substrate. Therefore, even if a field-effect transistor is manufactured by forming a gate electrode on (11-20) plane as a main surface of the semiconductor layer including this III group nitride semiconductor, the main surface of the semiconductor layer is not a polar surface, so that polarized electric field is not generated in a direction of applying a gate voltage. As a result, it is possible to realize a normally-off field-effect transistor including a III group nitride semiconductor.

Further, the semiconductor device may further include a buffer layer which is between the semiconductor layer and the substrates, and made of a III group nitride semiconductor, wherein said semiconductor layer has a layer which is made of $In_xAl_yGa_{1-x-y}N$ (where $0\leq x<1$, $0<y<1$).

With the above structure, on the substrate, a [11-20] axial oriented GaN-based compound semiconductor having good crystallinity is formed. As a result, by manufacturing a field-effect transistor using this GaN-based compound semiconductor, it is possible to realize a normally-off field-effect transistor having a low on-resistance and a high breakdown voltage.

Still further, a thickness of the buffer layer in a direction perpendicular to the main surface of the substrate may be equal to or more than 500 nm, and a total thickness of the semiconductor layer and the buffer layer in a direction perpendicular to the main surface of the substrate may be equal to or less than 5 μm.

When the thickness of the buffer layer is less than 500 nm, a lattice strain in a layer stacked on the buffer layer is not appropriately relaxed, which results in generation of squamous morphology or pits on a surface of the stacked layer. As a result, it becomes difficult to form electrodes and the like, which makes it difficult to form a device structure such as a transistor structure. Moreover, when a thickness of the semiconductor layer including the buffer layer formed on the substrate is greater than 5 μm, a crack is generated on the surface of the semiconductor layer. As a result, it becomes difficult to form electrodes and the like, which makes it difficult to form a device structure such as a transistor structure. Therefore, by setting the thickness of the buffer layer to 500 nm or more, and the total thickness of the semiconductor layer to 5 μm or less, it is possible to easily form the device structure. That is, it is possible to easily realize the normally-off field-effect transistor having a low on-resistance and a high breakdown voltage.

Still further, the semiconductor device may be a field-effect transistor, and further include a gate electrode which is on the semiconductor layer. Still further, a gate length direction of the gate electrode may be parallel to a [1-100] axis of the semiconductor layer.

In the case of a semiconductor layer including an A-axial oriented III group nitride semiconductor, on the surface of the layer, hair-lined morphology is generated in a direction parallel to a [0001] axis of the III group nitride semiconductor. Therefore, when a gate electrode is positioned so that a gate length direction becomes parallel to the [1-100] axis of the III group nitride semiconductor, a source-to-drain current flows in a parallel to a direction of the hair-lined morphology. As a result, carriers can flow without being scattered, thereby increasing the source-to-drain current, so that a power field-effect transistor for large current can be realized.

Still further, a thickness of the semiconductor layer in a direction perpendicular to the main surface of the substrate may be equal to or less than 2 μm.

When the thickness of the semiconductor layer including the A-axial oriented III group nitride semiconductor is 2 μm or more, it becomes difficult to realize RMS of 10 nm or less. When the RMS is greater than 10 nm, it becomes difficult to form electrodes and an insulating film to be adhered to the semiconductor layer surface, and also difficult to perform accurate photolithography. Therefore, by setting the thickness of the semiconductor layer to be less than 2 μm, defectives are hardly manufactured and yield can be improved. As a result, it is possible to realize the normally-off field-effect transistor having a low on-resistance and a high breakdown voltage, with a low cost.

Still further, the semiconductor layer may have a heterojunction of a $Al_wGa_{1-w}N$ (where $0<w<1$) layer and a gallium nitride (GaN) layer.

With the above structure, the $Al_wGa_{1-w}N$ ($0<w<1$)/GaN heterojunction having a large band offset is formed in the semiconductor layer. Here, in the case of the A-axial oriented III group nitride semiconductor, polarization is not generated in a direction parallel to the [11-20] axis, in other words, in a growth direction from the substrate. Therefore, the semiconductor layer becomes non-polar in a growth direction perpendicular to an $Al_wGa_{1-w}N$/GaN hetero interface, so that the $Al_wGa_{1-w}N$/GaN hetero interface is not affected by spontaneous polarization and piezoelectric polarization, and piezo charge is not accumulated in the $Al_wGa_{1-w}N$/GaN hetero interface. As a result, unlike the conventional field-effect transistor formed on (0001) plane, a drain current does not flow even when a gate voltage is 0 V, so that a normally-off field-effect transistor can be realized.

Still further, the $Al_wGa_{1-w}N$ ($0<w<1$) layer may be doped to have an n-type conductivity. Still further, the $Al_wGa_{1-w}N$ ($0<w<1$) layer may be doped with a doping concentration of $1\times10^{19}$ cm$^{-3}$ or more.

With the above structure, a sheet carrier density of the $Al_wGa_{1-w}N$/GaN hetero interface can be controlled by the doping concentration.

Still further, a full width at half maximum (FWHM) of an X-ray rocking curve of the semiconductor layer may be equal to or less than 2000 arcsec.

A small FWHM of a so-called tilt angle of the X-ray rocking curve means that crystallinity is good and variation of crystalline orientation is small. When the X-ray rocking curve FWHM of the semiconductor layer is greater than 2000 arcsec, the variation of crystalline orientation becomes large and the lattice orientation is distorted, which eventually generates spontaneous polarization and piezopolarization in a growth direction. As a result, polarization charge is generated in the hetero interface, which makes it difficult to manufacture a normally-off field-effect transistor. Therefore, by setting the X-ray rocking curve FWHM of the semiconductor layer to 2000 arcsec or less, it is possible to realize the normally-off field-effect transistor having a low on-resistance and a high breakdown voltage.

Moreover, the present invention can be a method of manufacturing a semiconductor device including forming a semiconductor layer made of a III group nitride semiconductor, on a main surface of the substrate, wherein a [11-20] axis of the semiconductor layer is perpendicular to the main surface of the substrate.

With the above method, it is possible to realize a normally-off field-effect transistor including a III group nitride semiconductor.

Further, the method of manufacturing the semiconductor device may include cleaning the substrate surface by applying a heat treatment of 1000° C. or more to the substrate. Still further, the heat treatment may be applied in an ammonia ($NH_3$), nitrogen dioxide ($N_2$), or hydrogen ($H_2$) atmosphere.

Thereby the substrate surface can be cleaned by the processing of heat treatment at 1000° C. or more, so that it is possible to improve crystallinity of a [11-20] axial oriented III group nitride semiconductor which is formed on the substrate surface.

Still further, the method may further include forming a buffer layer, wherein in the forming of the semiconductor layer, the semiconductor layer having a layer made of $In_xAl_yGa_{1-x-y}N$ (where $0 \leq x<1$, $0<y<1$) is formed on the buffer layer.

With the above method, it is possible to grow [11-20] axial oriented $In_xAl_yGa_{1-x-y}N$ ($0 \leq x<1$, $1<y<1$) having good crystallinity on the substrate. As a result, by manufacturing field-effect transistor using this $In_xAl_yGa_{1-x-y}N$, it is possible to realize the normally-off field-effect transistor having a low on-resistance and a high breakdown voltage.

Still further, in the forming of the buffer layer, the buffer layer made of aluminium nitride (AlN) may be formed, by growing aluminium nitride (AlN) crystal on the main surface of the substrate at a temperature that is within a range from 1000° C. to 1400° C.

A lattice constant of the III group nitride semiconductor in a <1-100> direction is 5.52 Å on A-plane of GaN, 5.39 Å on A-plane of AlN, and 4.75 Å on R-plane of sapphire. Therefore, in order to form the GaN layer above the R-plane of the sapphire substrate for example, the GaN layer is formed above the sapphire substrate sandwiching the AlN layer. Thereby, it is possible to relax lattice mismatch more, as compared to the case of forming the GaN layer directly on the sapphire substrate, which eventually makes it possible to form a GaN layer having good crystallinity. Here, when, in forming of the AlN layer, AlN crystal is grown at a temperature that is lower than 1000° C., atoms on the surface are not adequately migrated, while when AlN crystal is grown at a temperature that is higher than 1400° C., an amount of Al atoms is not enough to reach the substrate to form an AlN layer, so that in both cases it is difficult to form an AlN layer having an adequate growth rate and good crystallinity. Therefore, by growing AlN crystal at a temperature that is within a range from 1000° C. to 1400° C., it is possible to form an AlN layer having good crystallinity. As a result, when the GaN layer is formed on the AlN layer, GaN crystal is grown with the same crystalline orientation as the AlN layer, so that it is possible to form a [11-20] axial oriented GaN layer having good crystallinity. Thus, by manufacturing a field-effect transistor using this GaN, it is possible to realize the normally-off field-effect transistor having a low on-resistance and a high breakdown voltage.

Still further, in the forming of the buffer layer, the buffer layer made of gallium nitride (GaN) may be formed, by growing gallium nitride (GaN) crystal on the main surface of the substrate at a temperature that is within a range from 500° C. to 700° C.

In the forming of the buffer layer made of GaN, by growing crystal at a temperature that is within a range from 500° C. to 700° C., crystal nuclei made of amorphous GaN which is grown three-dimensionally is formed on the substrate. Then, by forming the GaN layer on the buffer layer at a temperature of 1000° C. or more, epitaxially lateral over growth is facilitated in the early period of the GaN layer forming to become two dimensional growth mode. As a result, it is possible to form a GaN layer having surface flatness and good crystallinity. Here, when the GaN crystal is grown at a temperature that is less than 500° C., source gas is not adequately decomposed, and when the GaN crystal is grown at a temperature that is more than 700° C., forming of the amorphous GaN becomes difficult. Therefore, with the above method, it is possible to form a [11-20] axial oriented GaN layer having good crystallinity. As a result, by manufacturing a field-effect transistor using this GaN layer, it is possible to realize the normally-off field-effect transistor having a low on-resistance and a high breakdown voltage.

Still further, the method may further include forming a buffer layer on the main surface of the substrate, wherein in the forming of the semiconductor layer, the semiconductor layer having a heterojunction of an $Al_wGa_{1-w}N$ (where $0<w<1$) layer and a gallium nitride GaN layer is formed on the buffer layer.

With the above method, it is possible to realize the normally-off field-effect transistor.

Still further, in the forming of the semiconductor layer, the gallium nitride (GaN) layer may be formed, by growing gallium nitride (GaN) crystal on the buffer layer at a temperature that is within a range from 1015° C. to 1045° C.

By setting a temperature for the GaN growth to be within a range from 1015° C. to 1045° C., it is possible to realize a GaN layer whose X-ray diffraction FWHM is 2000 arcsec or less and RMS is 20 nm, which is preferable to realize the normally-off field-effect transistor. Therefore, with the above method, it is possible to form a GaN layer having good crystallinity and surface flatness, which is suitable for the normally-off field-effect transistor.

Still further, the method may further include forming a buffer layer made of gallium nitride (GaN) on the main surface of the substrate, wherein in the forming of the semiconductor layer, the semiconductor layer is formed, by growing gallium nitride (GaN) crystal on the buffer layer at a rate that is equal to or more than 4 µm/hour.

By setting a GaN growth rate to 4 µm/hour or more, it is possible to realize RMS that is 20 nm or less, which is preferable to realize the normally-off field-effect transistor. As far as the RMS that is 20 nm or less can be achieved, the growth rate may be any rate that is 4 µm/hour or more. With the above method, it is possible to form GaN or $Al_wGa_{1-w}N$ ($0<w<1$)/GaN having good crystallinity and surface flatness, which results in realization of the normally-off field-effect transistor having a low on-resistance and a high breakdown voltage.

As described above, the semiconductor device and the manufacturing method thereof according to the present invention can realize the normally-off field-effect transistor which includes III group nitride semiconductor and has a low on-resistance and a high breakdown voltage. At the same time, it is also possible to realize a semiconductor light emitting device having high-efficient light emitting.

FURTHER INFORMATION ABOUT TECHNICAL BACKGROUND TO THIS APPLICATION

The disclosure of Japanese Patent Application No. 2005-146265 filed on May 19, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate specific embodiments of the present invention. In the Drawing.

DESCRIPTION OF THE PREFERRED EMBODIMENT(S)

The following describes embodiments according to the present invention with reference to the drawings.

First Embodiment

Figure 1:
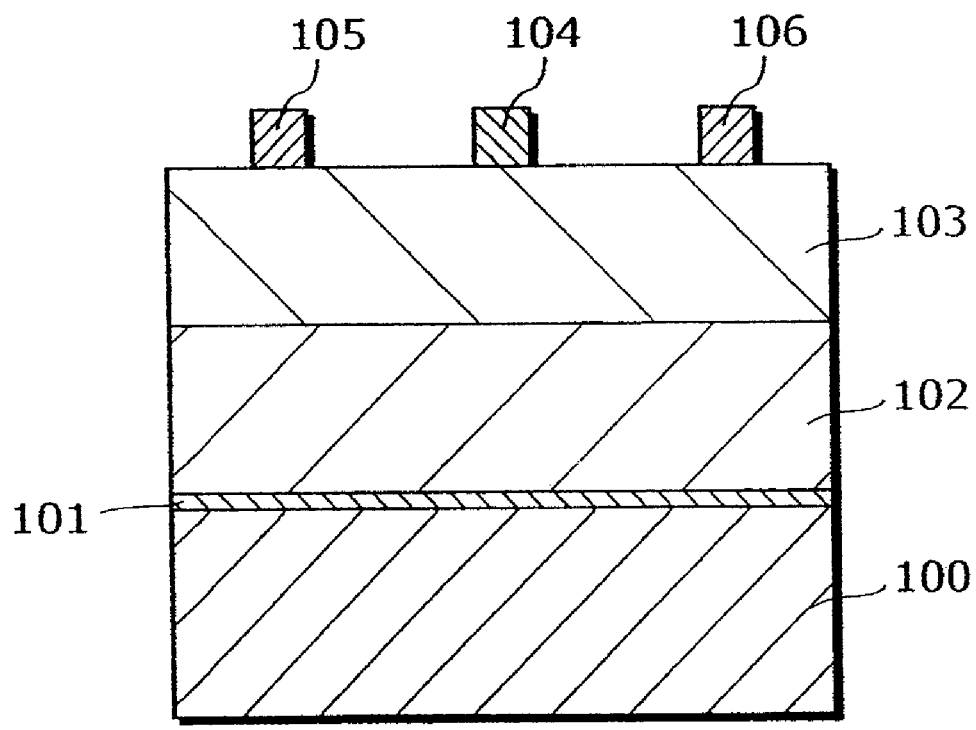
FIG. 1 is a cross-sectional view showing a structure of a conventional HFET.
Figure 2:
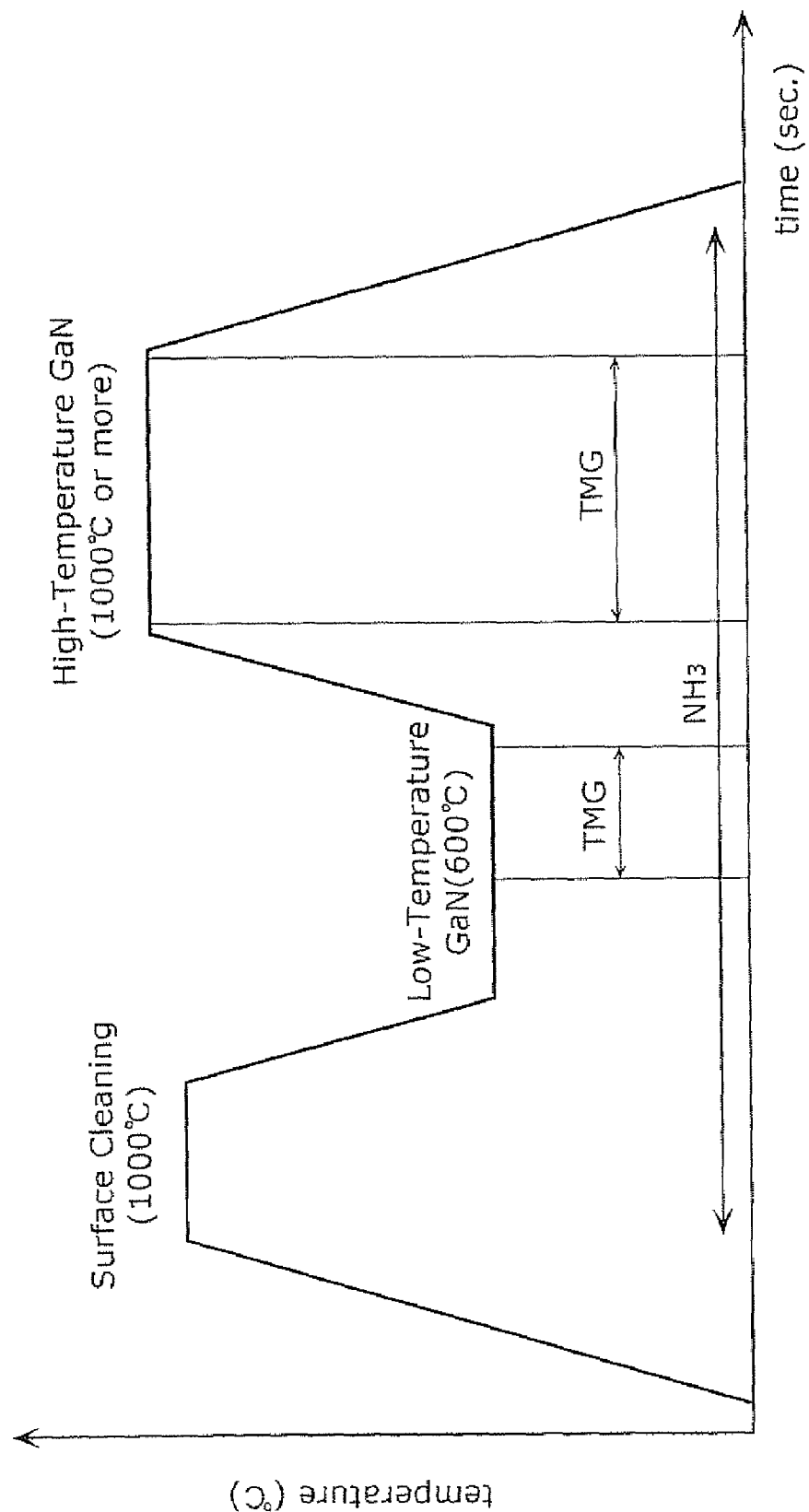
FIG. 2 is a graph showing a growth sequence in forming a GaN layer, according to the first embodiment of the present invention.

A method of forming a GaN layer according to the first embodiment is described. FIG. 2 is a graph showing a growth sequence in the forming of the GaN layer by a crystal growth method. Note that the GaN layer is one example of the semiconductor layer of the present invention.

Firstly, a sapphire substrate whose main surface is R-plane, that is (10-12) plane, is placed in a crystal growth chamber.

Next, the sapphire substrate is heated to 1000° C. or more, and then a surface of the sapphire substrate is cleaned for, for example, five minutes by a heat treatment in an ammonia ($NH_3$), nitrogen dioxide ($N_2$), or hydrogen ($H_2$) atmosphere. After that, the sapphire substrate is cooled down to 600° C. or less.

Then, after a temperature in the crystal growth chamber is increased to 600° C., at this temperature, on the main surface of the sapphire substrate, GaN crystal is grown for, for example, five minutes by a metal organic chemical vapor deposition (MOCVD) method. Thereby a low-temperature GaN buffer layer, which is A-axial oriented, in other words, whose [11-20] axis is perpendicular to the main surface of the sapphire substrate, is formed.

Finally, after the temperature in the crystal growth chamber is increased to 1000° C., at this temperature, on the low-temperature GaN buffer, GaN crystal is grown by the MOCVD method at a growth rate of 4 μm (4 μm/hour) or more. Thereby a GaN layer having a thickness of 1 μm, which is A-axial oriented, in other words, whose [11-20] axis is perpendicular to the main surface of the sapphire substrate, is formed. Here, the thickness means a length in a direction perpendicular to the main surface of the sapphire substrate.

By the above-described growth sequence, it is possible to form the GaN layer whose main surface is A-plane, that is (11-20) plane.

Note that, because of relatively easy procurement, inexpensiveness, and characteristics for forming GaN-based crystal having a non-polar surface and good crystallinity, in the above-described forming of the GaN layer, the sapphire substrate is used as a substrate on which the crystal is grown. However, the substrate is not limited to the above as far as GaN-based crystal having a non-polar surface can be grown on the substrate, and the substrate, such as a silicon (Si) substrate, a silicon carbide (SiC) substrate, a zinc oxide (ZnO) substrate, or a GaN substrate, may be used.

Note also that, in the above-described forming of the GaN layer, the GaN crystal is grown by the MOCVD method, but the method is not limited to the above, and GaN crystal may be grown by a molecular beam epitaxy (MBE) method or a hydride vapor phase epitaxy (HVPE) method.

Note also that, in the above-described forming of the GaN layer, the low-temperature GaN buffer layer is formed by crystal growth at a temperature of 600° C., but the temperature is not limited to the above as far as the temperature is within a range from 500° C. to 700° C. In the forming of the low-temperature GaN buffer layer, by growing crystal at a temperature from 500° C. to 700° C., crystal nuclei made of amorphous GaN which are grown three-dimensionally are formed on the substrate. Then, by forming the GaN layer on the low-temperature buffer layer at a temperature of 1000° C. or more, in the early period of the GaN layer forming, epitaxially lateral over growth is facilitated and becomes a two-dimensional growth mode. As a result, the GaN layer having surface flatness and good crystallinity can be formed. Here, if the GaN crystal is grown at a temperature that is less than 500° C., source gas is not adequately decomposed. On the other hand, if the GaN crystal is grown at a temperature that is more than 700° C., the amorphous GaN is difficult to be formed. Therefore, at the temperature from 500° C. to 700° C., it is possible to form the GaN layer which is [11-20] axial oriented and has good crystallinity.

Figure 3:
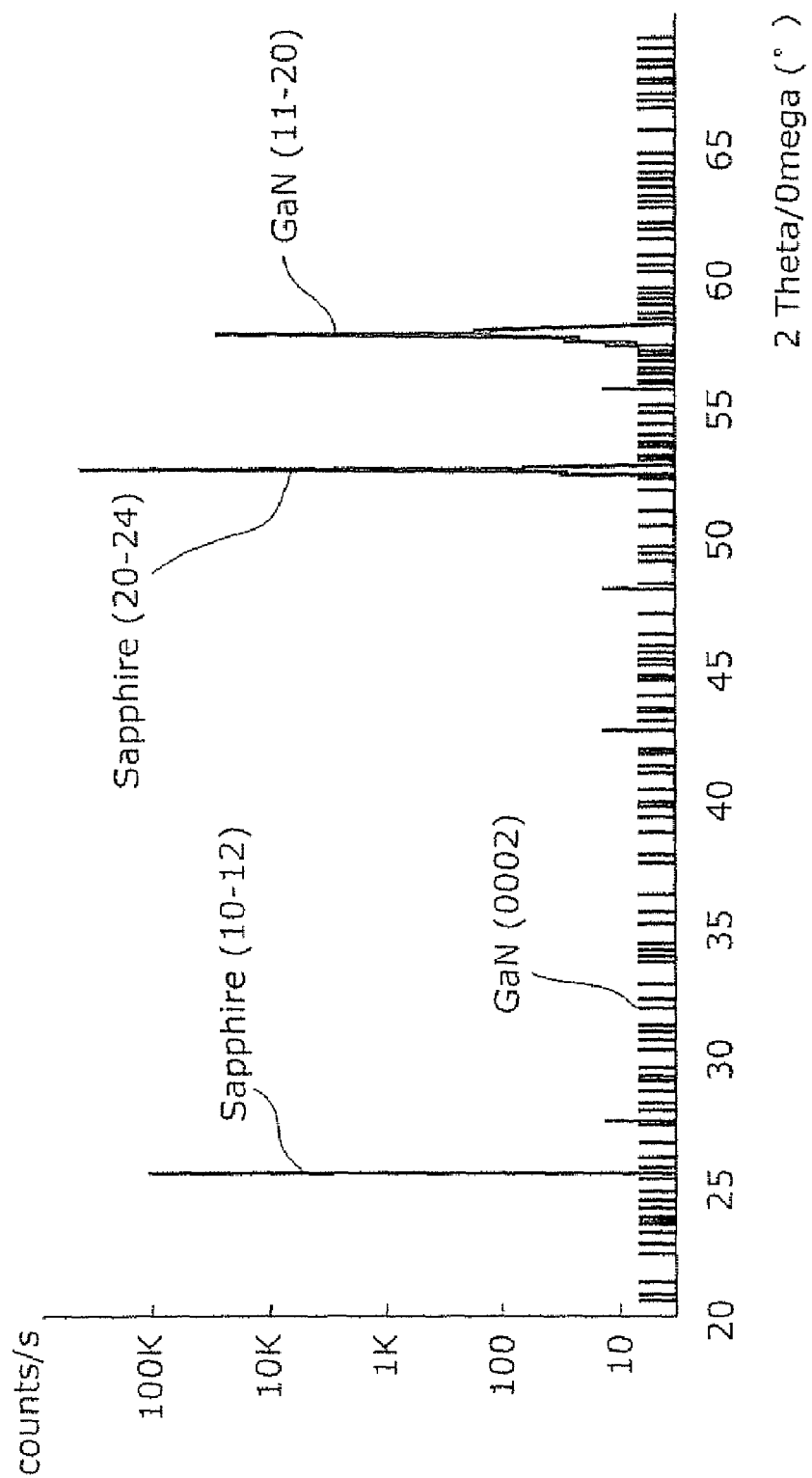
FIG. 3 is a graph showing a result of X-ray diffraction measurement for the GaN layer, according to the first embodiment of the present invention.

FIG. 3 is a graph showing a 2θ/ω profile obtained by X-ray diffraction measurement for the GaN layer which is formed in the growth sequence shown in FIG. 2.

As shown in FIG. 3, peaks of diffraction angles of (10-12) plane and (20-24) plane resulted from R-plane of sapphire are observed, and at 57.8°, a peak of a diffraction angle of (11-20) plane resulted from A-plane of GaN is noticeably observed. However, peaks of C-axial, R-axial, and M-axial oriented GaN, in other words, peaks resulted from C-plane, R-plane, and M-plane of GaN, are not observed. Therefore, it is understand that, in the growth sequence shown in FIG. 2, only the GaN whose main surface is A-plane, in other words, only the A-axial oriented GaN, is grown on the substrate.

Figure 4:
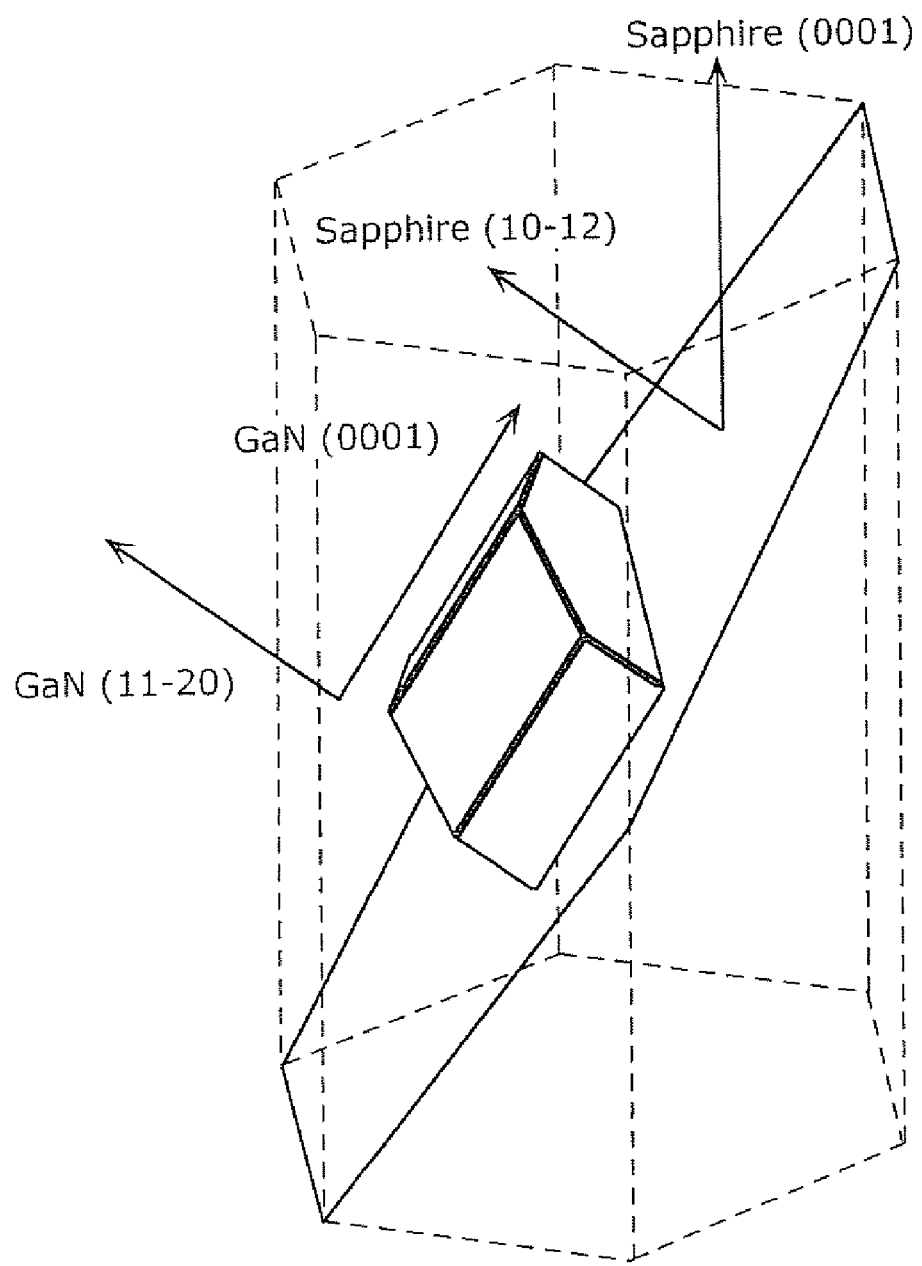
FIG. 4 is a view showing how A-axial oriented GaN crystal is grown on R-plane of sapphire.

FIG. 4 is a view showing how the A-axial oriented GaN crystal is grown on R-plane of sapphire.

Figure 5:
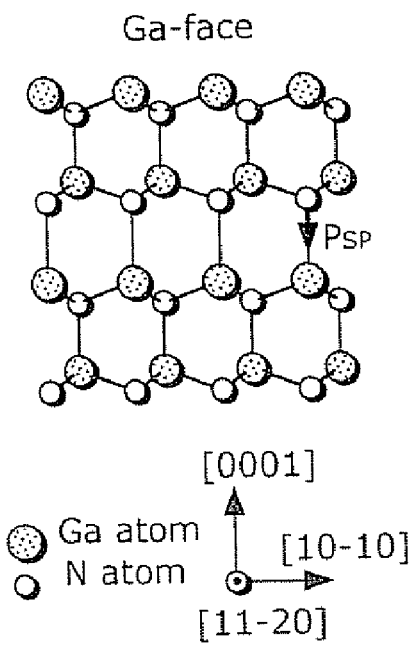
FIG. 5 is a diagram showing atomic positions of GaN.
Figure 6:
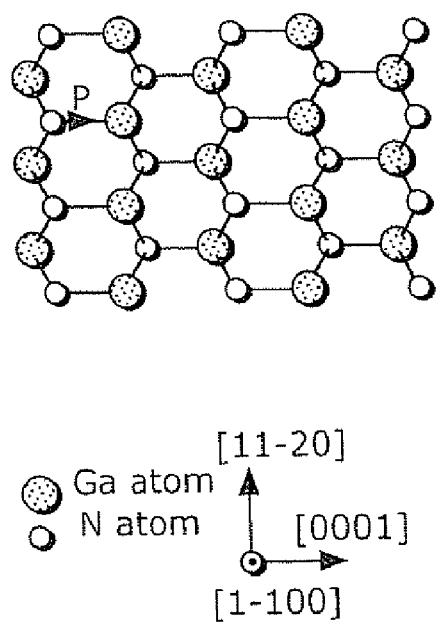
FIG. 6 is a diagram showing atomic positions of GaN.

The R-plane of sapphire that is (10-12) plane, is positioned at a 58 degree angle from C-plane of sapphire that is (0001) plane when GaN is deposited on the R-plane, by controlling conditions of the growth, the GaN crystal is grown having A-axis orientation. As shown in FIG. 5, in the case of GaN whose main surface is C-plane, a gallium (Ga) atom and a nitrogen (N) atom are arranged side by side in a [0001] direction which is a growth direction, so that significant polarization is generated in the growth direction. However, as shown in FIG. 6, in the case of GaN whose main surface is A-plane, a Ga atom and a N atom are arranged on (11-20) plane which is a growth plane, so that polarization is not generated in a direction parallel to [11-20] axis, in other words, in the growth direction. Therefore, when, for example, a heterostructure field effect transistor (HFET) is manufactured using an AlGaN/GaN heterojunction, polarization is not generated in a growth direction, thereby preventing polarization generation in a direction perpendicular to an AlGaN/GaN hetero interface, so that it is possible to control a sheet carrier density of the AlGaN/GaN heterojunction within a wide range, and manufacture a normally-off field-effect transistor.

Figure 7:
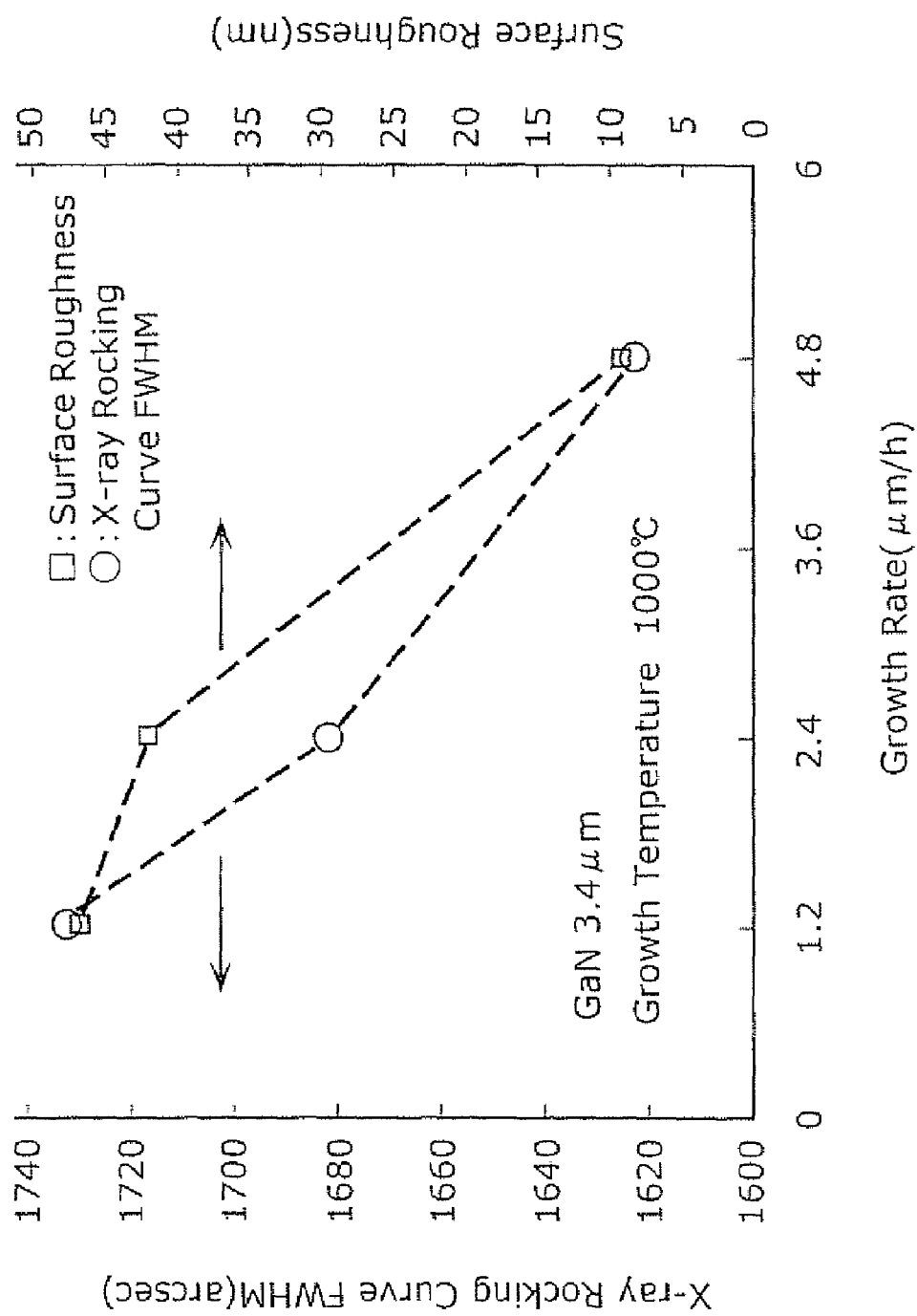
FIG. 7 is a graph showing a growth rate dependency of an X-ray rocking curve FWHM, and surface roughness observed by AFM, regarding (11-20) plane of the GaN layer according to the first embodiment of the present invention.

FIG. 7 is a graph showing a growth rate dependency of an X-ray rocking curve full width at half maximum (FWHM), and surface roughness (RMS) observed by an atomic force microscope (AFM), regarding (11-20) plane of the GaN layer formed in the growth sequence shown in FIG. 2. Note that a total thickness of the GaN layer and the low-temperature GaN buffer layer is 3.4 μm, and the GaN layer is formed at a growth temperature of 1000° C. Note also that the growth rate is a growth rate of GaN in the GaN layer forming.

FIG. 7 shows that, as the GaN growth rate is increased, the X-ray rocking curve FWHM is lowered and crystallinity is improved. Furthermore, it is shown that, as the GaN growth rate is decreased, the RMS is lowered and the flatness is improved. Here, in order to realize a normally-off field-effect transistor, it is desired that the RMS is 20 nm or less. Therefore, by forming an A-axial oriented GaN layer at a growth rate of 4 μm (4 μm/hour) or more, it is possible to realize a normally-off field-effect transistor having a low on-resistance and a high breakdown voltage.

As described above, in the GaN layer of the first embodiment, polarization is not generated in a direction parallel to [11-20] axis, in other words, in a growth direction from the sapphire substrate. Therefore, even if a field-effect transistor is manufactured by forming a gate electrode on this GaN layer, a main surface of the semiconductor layer is not a polar surface, so that polarized electric field is not generated in a direction of applying a gate voltage. As a result, a normally-off field-effect transistor can be realized.

Second Embodiment

Figure 8:
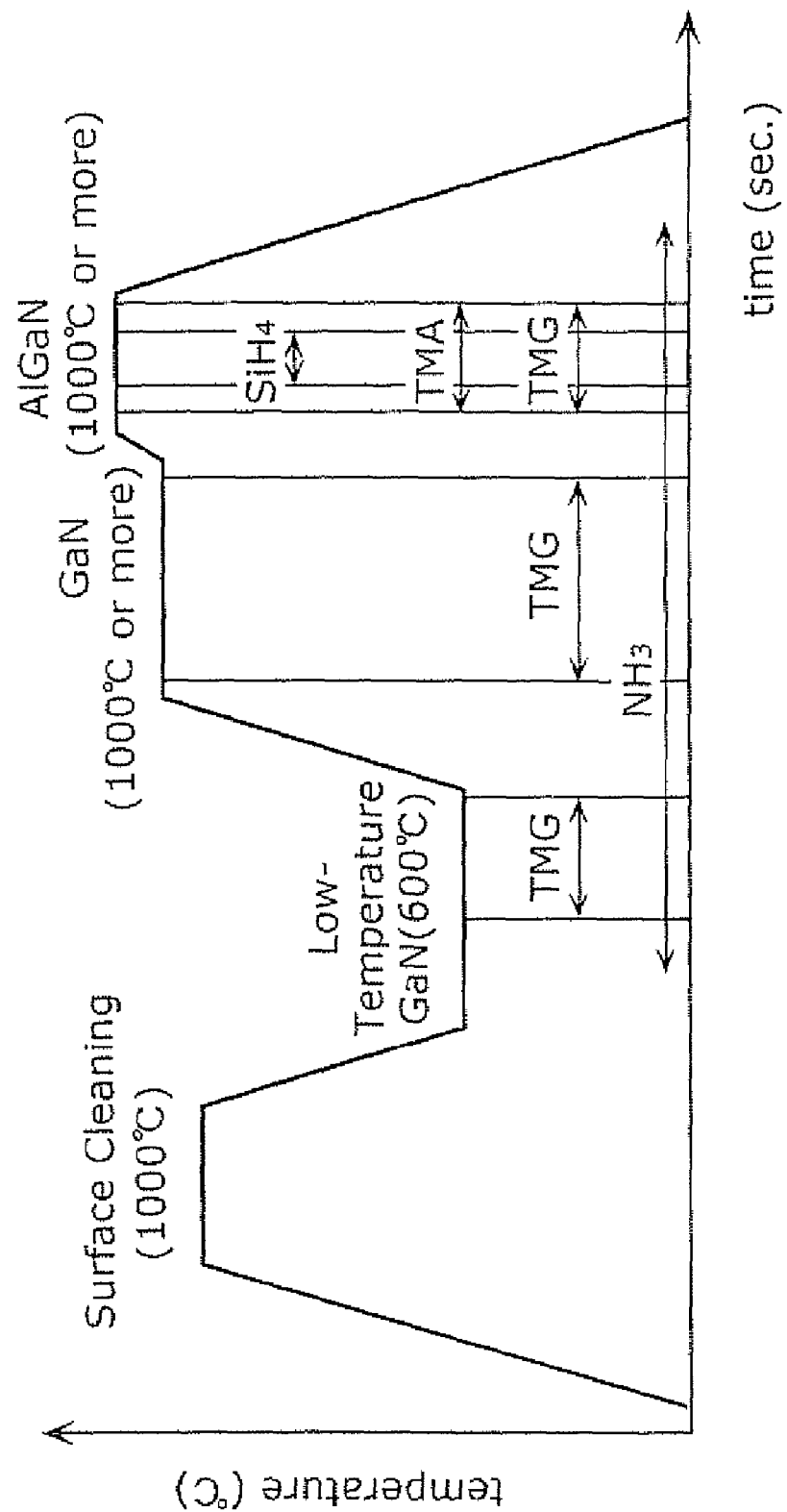
FIG. 8 is a graph showing a growth sequence in forming of a HFET epitaxial layer, according to a second embodiment of the present invention.

A method of forming a HFET epitaxial layer according to the second embodiment is described. FIG. 8 is a graph showing a growth sequence in the forming of the HFET epitaxial layer by a crystal growth method. Note that the HFET epitaxial layer, which is an epitaxial used in a HFET, is one example of the semiconductor layer of the present invention.

Firstly, a sapphire substrate whose main surface is R-plane, that is (10-12) plane, is placed in a crystal growth chamber.

Next, the sapphire substrate is heated to 1000° C. or more, and then a surface of the sapphire substrate is cleaned for, for example, five minutes by a heat treatment in a $NH_3$, $N_2$, or $H_2$ atmosphere. After that, the sapphire substrate is cooled down to 600° C. or less.

Then, after a temperature in the crystal growth chamber is increased to 600° C., at this temperature, on the main surface of the sapphire substrate, GaN crystal is grown by the MOCVD method for, for example, five minutes, to form a low-temperature GaN buffer.

Next, after the temperature in the crystal growth chamber is increased to a temperature that is within a range from 1015° C. to 1045° C., at this temperature, on a main surface of the low-temperature GaN buffer, GaN crystal is grown by the MOCVD method at a rate of 4 μm (4 μm/hour) or more. Thereby an A-axial oriented GaN layer having a thickness of 1 μm is formed.

Finally, after the temperature in the crystal growth chamber is increased more, on a main surface of the GaN layer, grown sequentially by the MOCVD method are: i-$Al_xGa_{1-x}N$ (0<x<1) (where i-means intrinsic, in other words, undoped); n-$Al_xGa_{1-x}N$ (where n-means being doped to have n-type electro-conductivity); and i-$Al_xGa_{1-x}N$. Thereby an A-axial oriented $Al_xGa_{1-x}N$ layer having a thickness of 25 nm is formed. Here, a doping concentration for the n-$Al_xGa_{1-x}N$ layer is determined in consideration of a threshold voltage required for the HFET. For example, if the threshold voltage needs to be about 0 V, the doping concentration is set to $4 \times 10^{13}$ $cm^{-2}$.

In such growth sequence, an $Al_xGa_{1-x}N$/GaN heterojunction is formed, and thereby an A-axial oriented HFET epitaxial layer can be formed.

Note that, in the above-described forming of the HFET epitaxial layer, the sapphire substrate is used as a substrate on which the crystal is grown. However, the substrate is not limited to the above as far as GaN or $Al_xGa_{1-x}N$ crystal having a non-polar surface can be grown on the substrate, and the substrate, such as a Si substrate, a SiC substrate, a ZnO substrate, or a GaN substrate, may be used.

Note also that, in the above-described forming of the HFET epitaxial layer, the crystal is grown by the MOCVD method, but the method is not limited to the above, and the crystal may be grown by the VIBE method or the HVPE method.

Note also that, in the above-described forming of the GaN layer, the low-temperature GaN buffer layer is formed by crystal growth at a temperature of 600° C., but the temperature is not limited to the above as far as the temperature is within a range from 500° C. to 700° C.

Figure 9A:
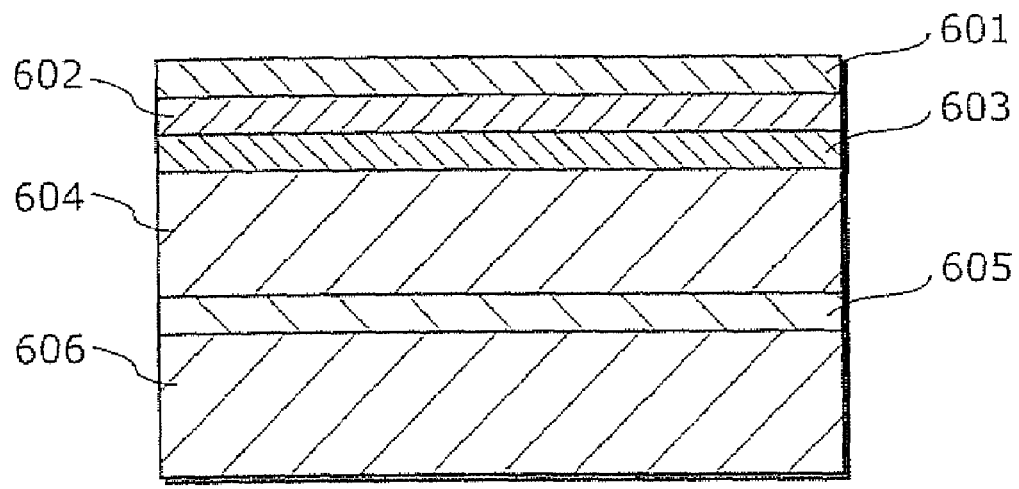
FIG. 9A is a cross-sectional view showing a structure of the HFET epitaxial layer, according to the second embodiment of the present invention.

FIG. 9A is a cross-sectional view showing a structure of the HFET epitaxial layer which is formed in the growth sequence shown in FIG. 8.

This HFET epitaxial layer includes a GaN buffer layer 605, an undoped GaN layer 604, an undoped AlGaN spacer layer 603, an n-type doped AlGaN electron supplying layer 602, and an undoped AlGaN cap layer 601, which are sequentially stacked on R-plane of a sapphire substrate 606. These layers and the substrate have thickness, composition, and the like as shown in the following table 1 for example. Note that, in the n-type doped AlGaN electron supplying layer 602, Si as a dopant is doped with a doping concentration of $4 \times 10^{13}$ $cm^{-2}$, for example.

TABLE 1

| | main surface | Al composition | thickness | dopant |
|---|---|---|---|---|
| sapphire substrate 606 | R-plane | 0 | 470 μm | — |
| GaN buffer layer 605 | A-plane | 0 | 50 μm | undoped |
| i-GaN layer 604 | A-plane | 0 | 1 μm | undoped |
| i-AlGaN layer 603 | A-plane | 0.26 | 7 nm | undoped |
| n-AlGaN layer 602 | A-plane | 0.26 | 15 nm | Si |
| i-AlGaN layer 601 | A-plane | 0.26 | 3 nm | undoped |

Here, when a thickness of the semiconductor layer formed on the sapphire substrate 606, in other words, a total thickness of the GaN buffer layer 605, the undoped GaN layer 604, the undoped AlGaN spacer layer 603, the n-type doped AlGaN electron supplying layer 602, and the undoped AlGaN cap layer 601, is 2 μm or more, flatness of the HFET epitaxial layer surface is deteriorated, and it becomes difficult to realize that RMS of 10 nm or less. When the RMS is greater than 10 nm, it becomes difficult to form electrodes and an insulating film to be adhered to the semiconductor layer, and also difficult to perform accurate photolithography, so that defectives are easily manufactured and yield is reduced. Therefore, in order to prevent the yield reduction, the total thickness of the GaN buffer layer 605, the undoped GaN layer 604, the undoped AlGaN spacer layer 603, the n-type doped AlGaN electron supplying layer 602, and the undoped AlGaN cap layer 601 is set to be less than 2 μm.

Figure 9B:
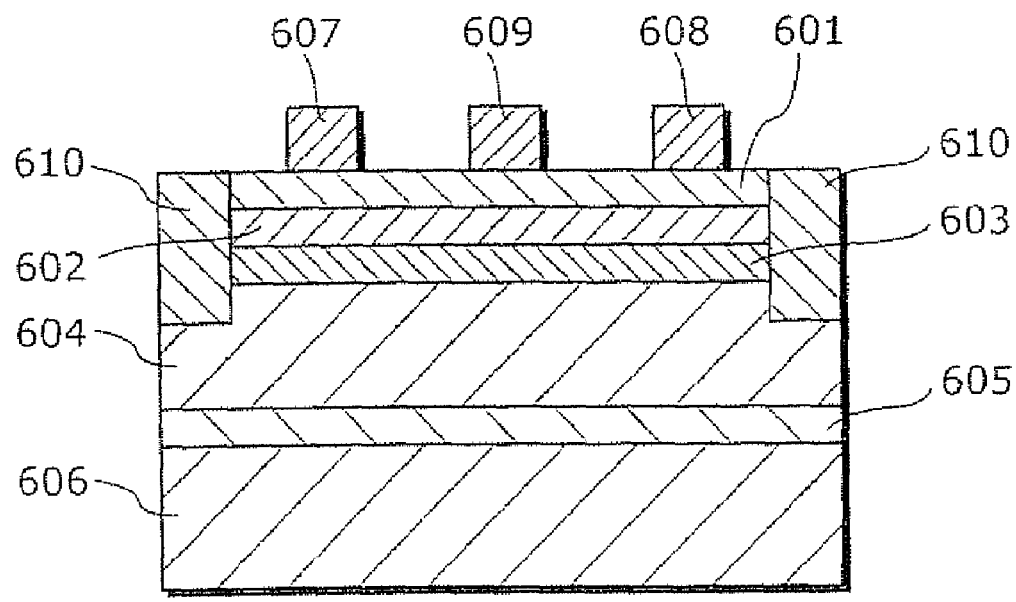
FIG. 9B is a cross-sectional view showing a structure of a HFET formed using the HFET epitaxial layer, according to the second embodiment of the present invention.

To this HFET epitaxial layer, in an oxygen containing atmosphere ($O_2$ or $H_2O$ atmosphere), thermal oxidation is selectively applied in order to form a thermal oxidation layer 610, thereby applying device isolation. After that, on the HFET epitaxial layer, titanium-aluminium (TiAl) is formed as a source electrode 607, TiAl is formed as a drain electrode 608, and palladium silicide (PdSi) as a gate electrode 609 are formed. Then, the HFET epitaxial layer is cleaved. As a result, the HFET shown in FIG. 9B is manufactured. Note that the HFET is one example of the semiconductor device of the present invention. Here, the gate electrode 609 is positioned so that a gate length direction becomes parallel to [1-100] axis of GaN. Note that the gate length direction means a length direction of the gate electrode 609 in a top-surface electrode pattern on the HFET epitaxial layer surface.

Figure 10:
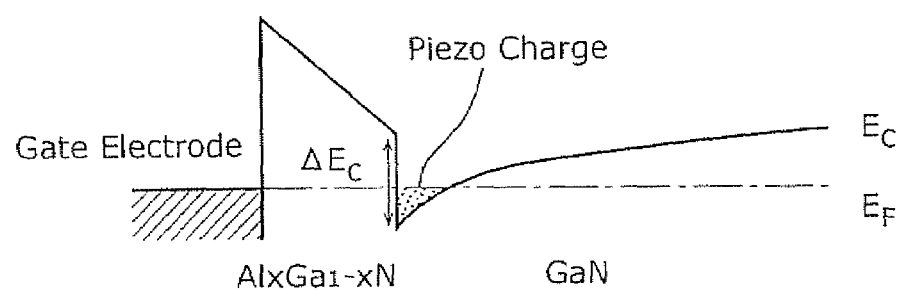
FIG. 10 is a band diagram of a conventional HFET epitaxial layer.
Figure 11:
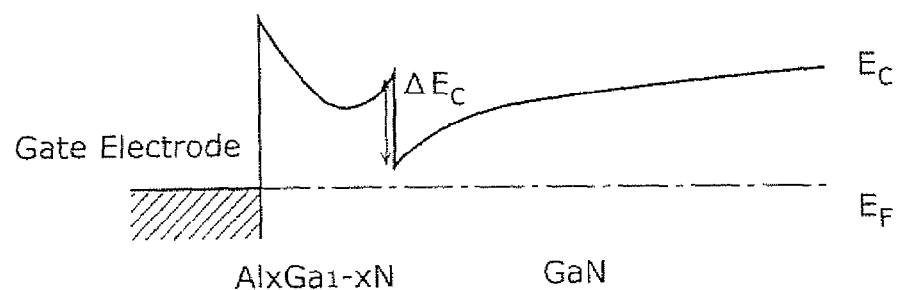
FIG. 11 is a band diagram of a HFET epitaxial layer according to the second embodiment of the present invention.

In the conventional HFET, the HFET epitaxial layer have been formed on C-plane of the substrate, so that, as shown in a band diagram of the conventional HFET epitaxial layer of FIG. 10, piezo charge is accumulated in the $Al_xGa_{1-x}N$/GaN hetero interface. However, in the HFET shown in FIG. 9B, the HFET epitaxial layer is formed on R-plane of the substrate, so that, as shown in a band diagram of the HFET epitaxial layer of the second embodiment of FIG. 11, piezo charge is not accumulated in the $Al_xGa_{1-x}N$/GaN hetero interface.

Figure 12:
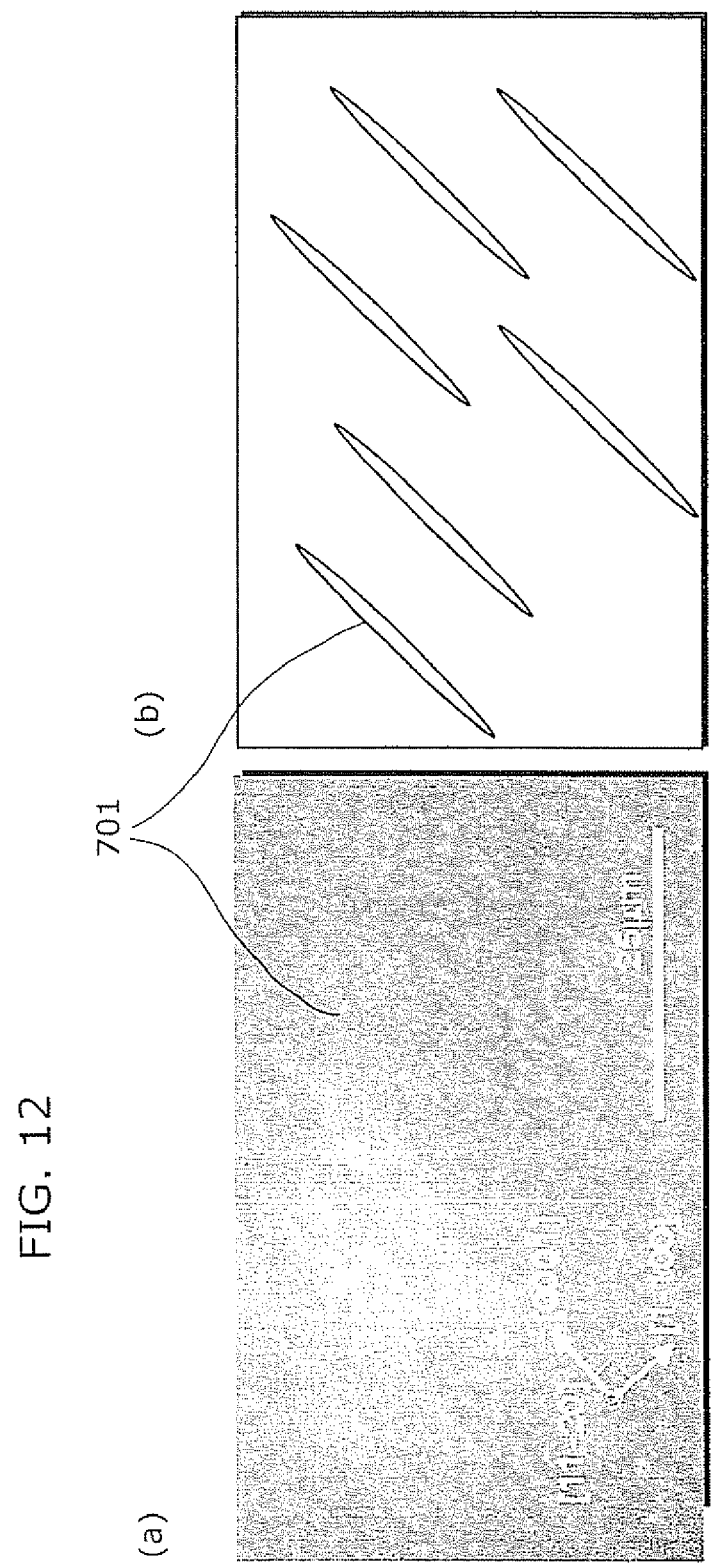
FIG. 12 is a photograph (left) and a schematic diagram (right) showing a surface morphology of the HFET epitaxial layer, according to the second embodiment of the present invention.

FIG. 12 is a photograph (left) and a schematic diagram (right) showing a surface morphology of the HFET epitaxial layer, which is formed in the growth sequence shown in FIG. 5.

As shown in FIG. 12, on the surface of the HFET epitaxial layer, hair-lined morphology 701, which is a convex part having a long and thin line shape parallel to [0001] axis of GaN, is observed characteristically. In this HFET epitaxial layer, a surface roughness (RMS) measured by an AFM is about 3 nm. Therefore, by forming a HFET epitaxial layer in the growth sequence shown in FIG. 8, the HFET epitaxial layer is formed to have surface flatness by which a device becomes operable.

Figure 13:
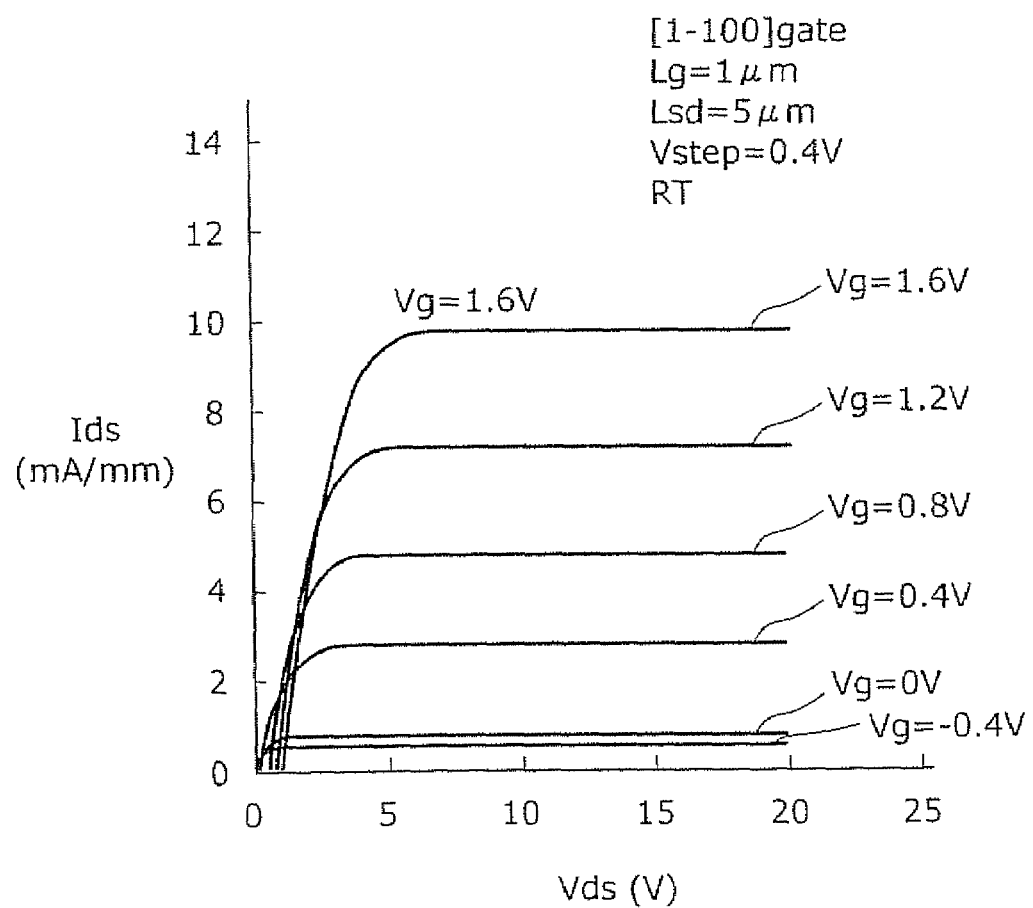
FIG. 13 is a graph showing current-voltage characteristics of the HFET formed using the HFET epitaxial layer, according to the second embodiment of the present invention.
Figure 14:
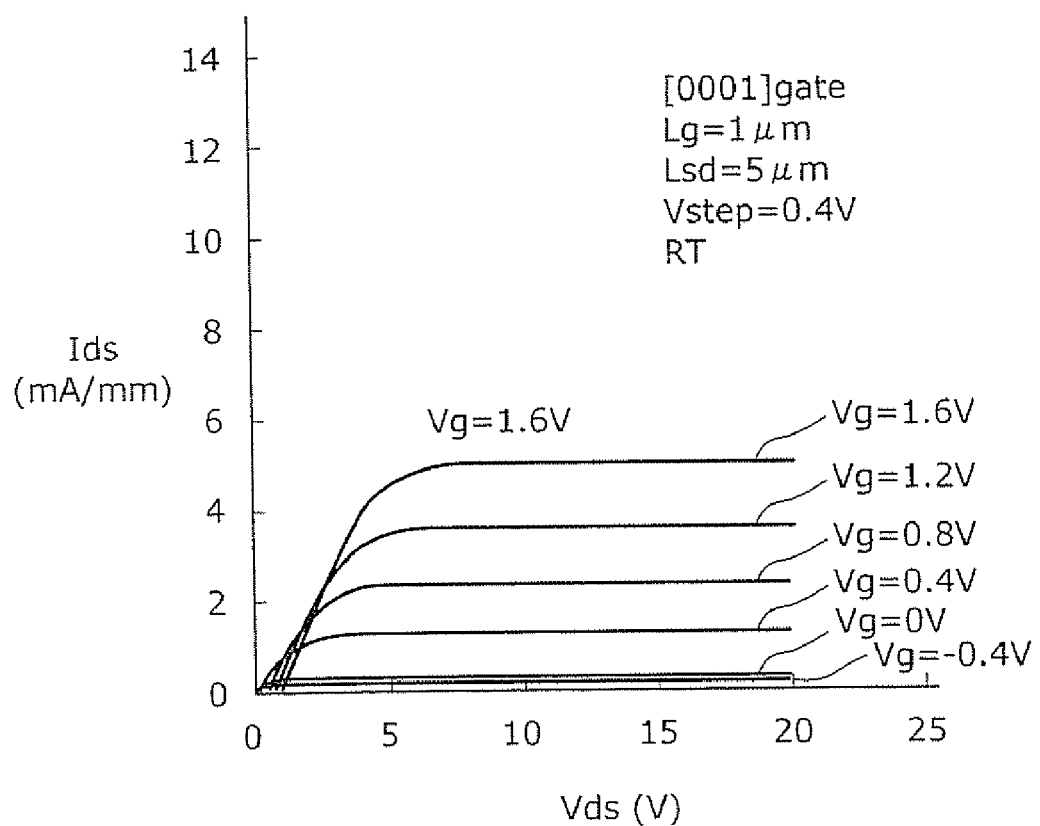
FIG. 14 is a graph showing current-voltage characteristics of the HEET formed using the HFET epitaxial layer, according to the second embodiment of the present invention.

FIGS. 13 and 14 are graphs each of which shows current-voltage characteristics of a HFET formed by the above-described HFET epitaxial layer.

Note that FIG. 13 is regarding a HFET having a gate electrode whose length direction is parallel to [1-100] axis of GaN, while FIG. 14 is regarding a HFET having a gate electrode whose length direction is parallel to [0001] axis of GaN.

As shown in FIGS. 13 and 14, in both of the HFET whose gate length direction is parallel to [1-100] axis of GaN and the HEET whose gate length direction is parallel to [0001] axis of GaN, when a threshold voltage is low, in other words, 0 V and −0.4 V, a source-to-drain current does not flow, so that it is understood that both HFETs have operation characteristics of a normally-off type. In addition, in comparing FIG. 14 with FIG. 13, it is understood that a source-to-drain current of the HFET whose gate length direction is parallel to [1-100] axis is greater than a source-to-drain current of the HFET whose gate length direction is parallel to [0001] axis. This is thought to be affected by the morphology shown in FIG. 12. More specifically, it is thought that, when a source-to-drain current is flowed in a direction parallel to the hair-lined morphology 701, more carriers can flow without being scattered, and as a result the source-to-drain current is increased. Note that a maximum source-to-drain current of the HFET whose gate length direction is so parallel to [1-100] axis of GaN shows 19.5 mA/mm, and a maximum transconductance of the same HFET shows 6.7 mS/mm.

Figure 15:
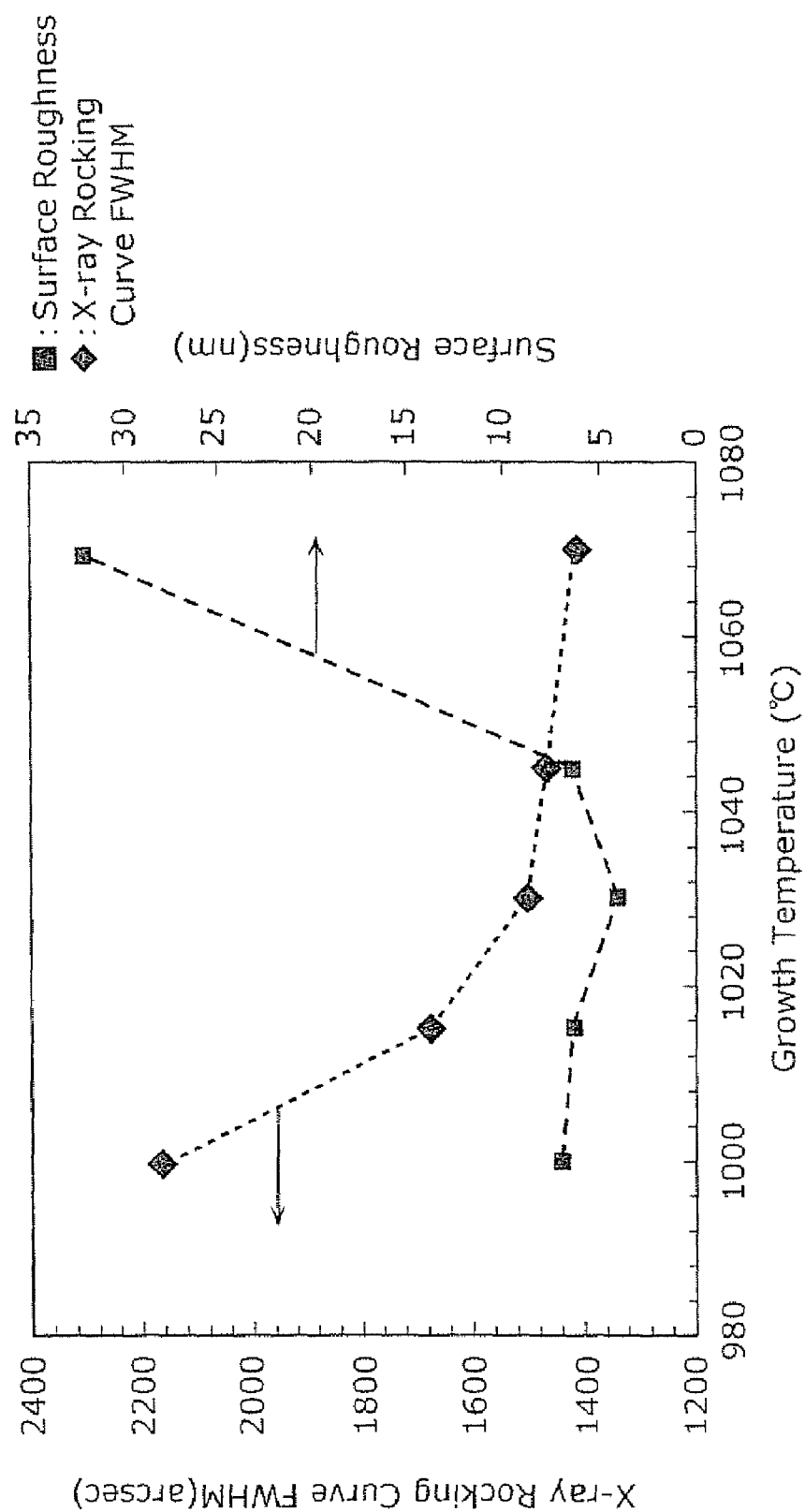
FIG. 15 is a graph showing a growth rate dependency of an X-ray rocking curve FWHM, and surface roughness observed by an AFM, regarding (11-20) plane of GaN in the HFET epitaxial layer, according to the second embodiment of the present invention.

FIG. 15 is a graph showing an X-ray rocking curve FWHM and a growth temperature dependency of surface roughness (RMS) observed by an AFM, regarding (11-20) plane of GaN in the HFET epitaxial layer which is formed in the growth sequence shown in FIG. 8. Here, the growth temperature means a growth temperature of GaN formed on the main surface of the low-temperature GaN buffer layer.

As shown in FIG. 15, it is understood that, as the growth temperature is increased, the X-ray rocking curve FWHM tends to be lowered and crystallinity tends to be better, while the surface roughness is rough and 33 nm, when the growth temperature is high about 1070° C. On the other hand, at a growth temperature of 1030° C., the X-ray rocking curve FWHM is 1500 arcsec and the surface roughness is 3.5 nm, so that it is understood that crystallinity of the HFET epitaxial layer is high and flatness of the surface is high. Here, when the X-ray rocking curve FWHM is greater than 2000 arcsec, variation of crystalline orientation becomes large and the GaN lattice orientation is distorted, so that spontaneous polarization and piezopolarization are generated in the GaN growth direction. Therefore, in order to realize a normally-off field-effect transistor, it is desirable that the X-ray rocking curve FWHM is 2000 arcsec or less, and the surface roughness is 20 nm. Thus, by forming a GaN layer at a growth temperature from 1015° C. to 1045° C., it is possible to realize a normally-off field-effect transistor having a low on-resistance and a high breakdown voltage.

Figure 16:
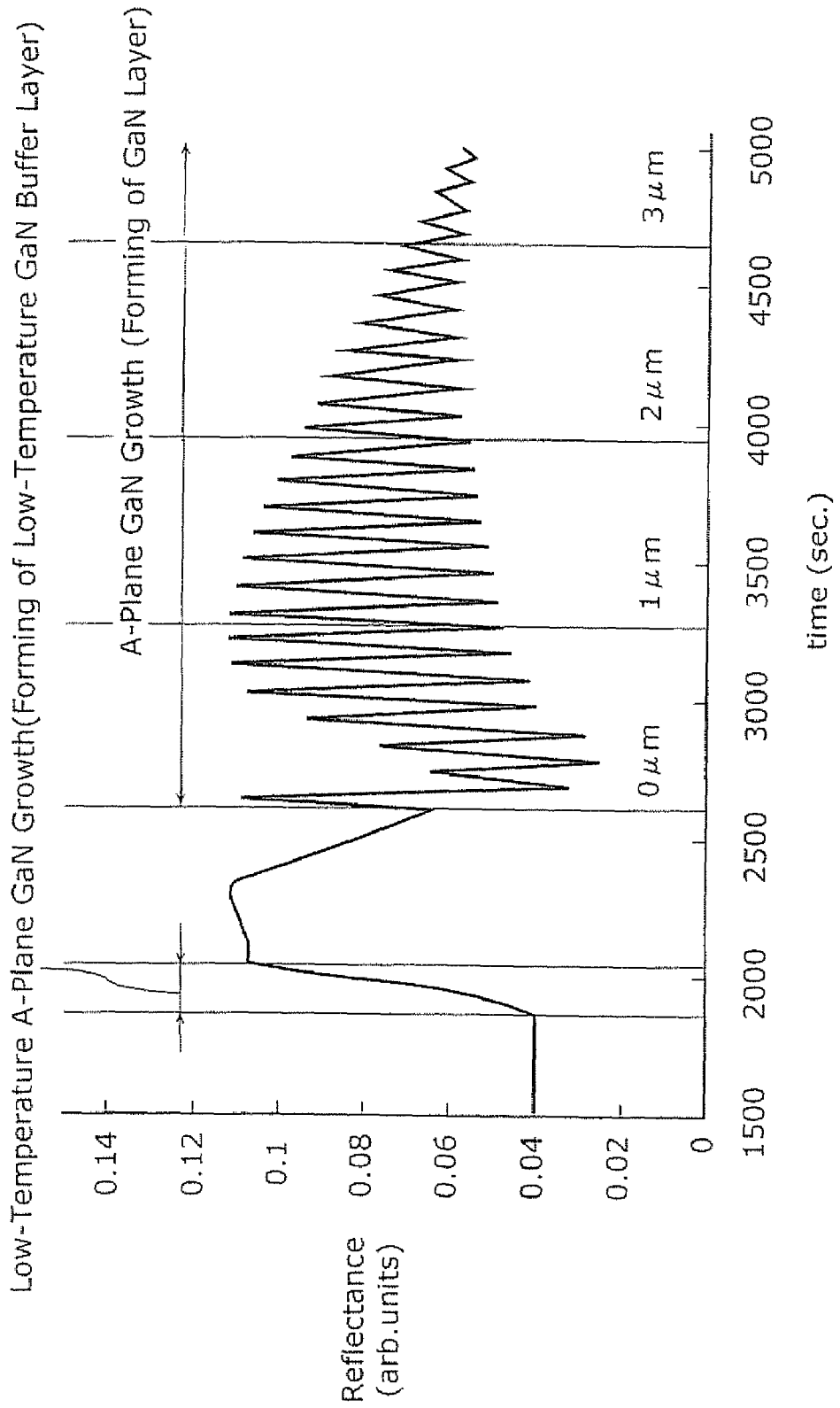
FIG. 16 is a graph showing changes with time in intensity of reflected light from a surface of GaN in forming of the HFET epitaxial layer, according to the second embodiment of the present invention.

FIG. 16 is a graph showing a measurement result of changes with time in intensity of reflected light from a surface of the GaN layer when laser beam is irradiated on the surface of the GaN layer, during the GaN growth in the growth sequence shown in FIG. 8.

GaN is grown at a constant growth rate, so that, during the GaN growth, by interference of reflected light from the surface of the GaN layer and reflected light from a boundary between the substrate and the GaN layer, the intensity of reflected light is varied every certain cycle. Here, an amplitude intensity of the reflected light shows flatness of the surface of the GaN layer during the growth. The amplitude intensity of reflected light is increase until a thickness of the GaN layer becomes 1 μm, but after that, the amplitude intensity is decreased, so that when the thickness of the GaN layer is 1 μm, the surface of the GaN layer becomes the flattest. Therefore, by setting the thickness of the GaN layer to about 1 μm, it is possible to realize a field-effect transistor having high surface flatness.

The thickness when the layer has the flattest surface varies depending on the growth rate. For example, it is expected that, if the growth rate is increased, the surface of the layer becomes the flattest when the thickness is greater than 1 μm. However, in any cases, it is desirable that the GaN layer is formed within a range of the amplitude intensity of reflected light that is not extremely reduced.

Note that in the forming of the HFET epitaxial layer of the second embodiment, the undoped AlGaN spacer layer 603, the n-type doped AlGaN electron supplying layer 602, and the undoped AlGaN cap layer 601 are sequentially stacked on the undoped GaN layer 604, but it is also possible to form a single n-type doped AlGaN electron supplying layer instead of these $Al_xGa_{1-x}N$ layers, to obtain the same effect as described above.

Third Embodiment

Figure 17:
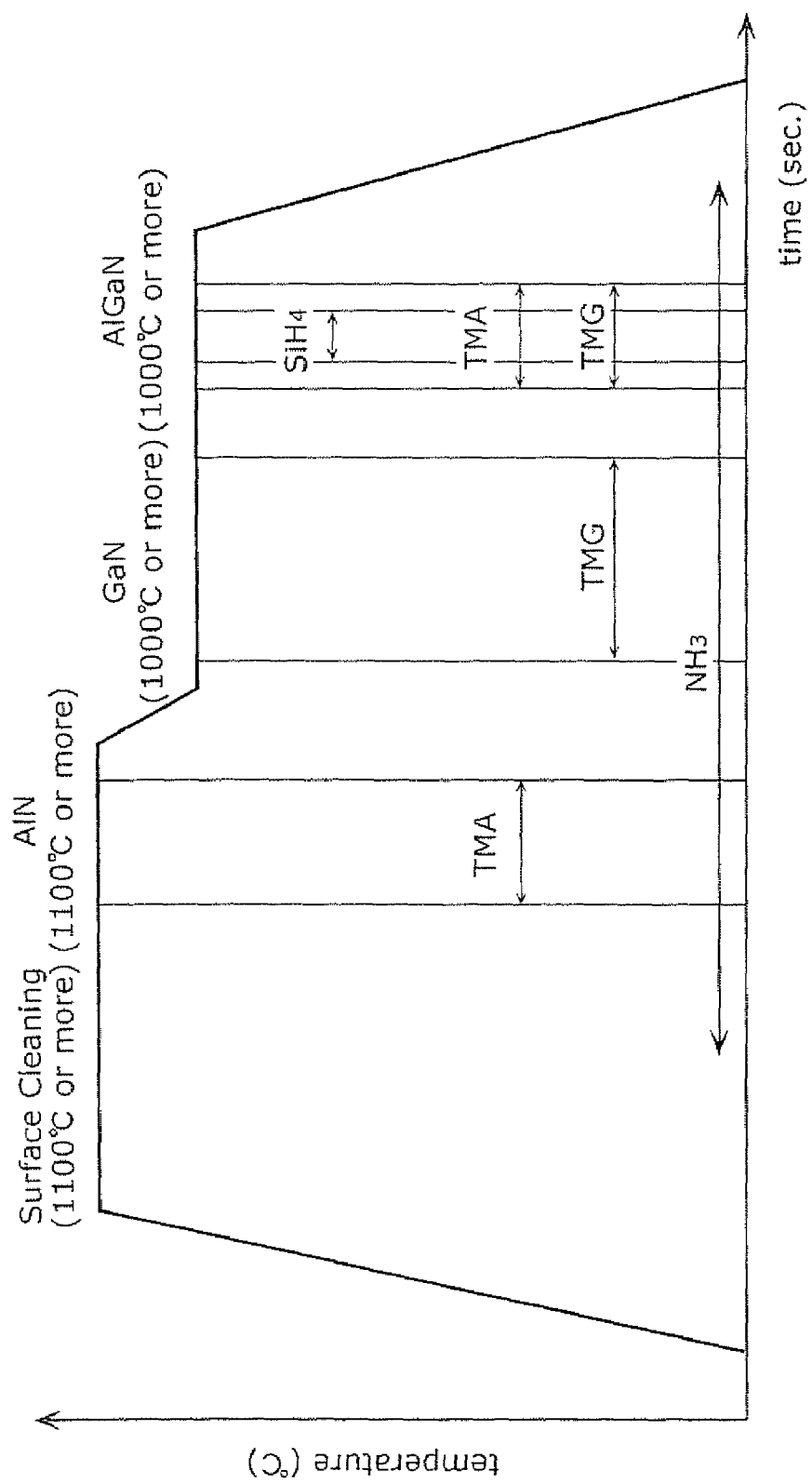
FIG. 17 is a graph showing a growth sequence in forming of a HFET epitaxial layer, according to a third embodiment of the present invention.

A method of forming a HFET epitaxial layer according to the third embodiment is described, FIG. 17 is a graph showing a growth sequence in the forming of the HFET epitaxial layer by a crystal growth method.

Firstly, a sapphire substrate whose main surface is R-plane, that is (10-12) plane, is placed in a crystal growth chamber.

Next, the sapphire substrate is heated to 1100° C. or more, and then a surface of the sapphire substrate is cleaned for, for example, five minutes by a heat treatment in a $NH_3$, $N_2$, or $H_2$ atmosphere.

Next, after a temperature in the crystal growth chamber is increased to 1100° C. or more, at this temperature, on the main surface of the sapphire substrate, GaN crystal is grown by the MOCVD method for, for example, five minutes. Thereby a high-temperature AlN buffer layer having a thickness of, for example, 500 nm, is formed.

Then, after the temperature in the crystal growth chamber is decreased to a temperature that is within a range from 1015° C. to 1045° C., at this temperature, on a main surface of the high-temperature AlN buffer, GaN crystal is grown by the MOCVD method. Thereby an A-axial oriented GaN layer having a thickness of 1 μm is formed.

Finally, on a main surface of the GaN layer, grown sequentially by the MOCVD method are: $i\text{-}Al_xGa_{1-x}N$ (0<x<1); $n\text{-}Al_xGa_{1-x}N$; and $i\text{-}Al_xGa_{1-x}N$. Thereby an A-axial oriented $Al_xGa_{1-x}N$ layer having a thickness of 25 nm is formed. Here, a doping concentration for the n-type $Al_xGa_{1-x}N$ layer is determined in consideration of a threshold voltage required for the HFET. For example, if the threshold voltage needs to be about 0 V, the doping concentration is set to $4\times10^{13}$ cm$^{-2}$.

In such growth sequence, an $Al_xGa_{1-x}N$/GaN heterojunction is formed, and thereby an A-axial oriented HFET epitaxial layer can be formed.

Note that, in the above-described forming of the HFET epitaxial layer, the sapphire substrate is used as a substrate on which the crystal is grown. However, the substrate is not limited to the above as far as GaN or $Al_xGa_{1-x}N$ crystal having a non-polar surface can be grown on the substrate, such as a Si substrate, a SiC substrate, a ZnO substrate, or a GaN substrate, may be used.

Note also that, in the above-described forming of the HFET epitaxial layer, the crystal is grown by the MOCVD method, but the method is not limited to the above, and the crystal may be grown by the MBE method or the HVPE method.

Note also that, in the above-described forming of the high-temperature AlN buffer layer, the AlN crystal is grown at a temperature of 1100° C. or more, but the temperature is not limited to the above as far as the temperature is within a range from 1000° C. to 1400° C. A lattice constant of a III group nitride semiconductor in a <1-100> direction is 5.52 Å on A-plane of GaN, 5.39 Å on A-plane of AlN, and 4.75 Å on R-plane of sapphire. Therefore, in order to form the GaN layer above the R-plane of the sapphire substrate for example, the GaN layer is formed above the sapphire substrate sandwiching the AlN layer. Thereby, it is possible to relax lattice mismatch more, as compared to the case of forming the GaN layer directly on the sapphire substrate, which eventually makes it possible to form a GaN layer having good crystallinity. Here, when, in forming of the AlN layer, AlN crystal is grown at a temperature that is lower than 1000° C., atoms on the surface are not adequately migrated, while when AlN crystal is grown at a temperature that is higher than 1400° C., Al atoms do not reach the substrate in order to form an AlN layer, so that in both cases it is difficult to form an AlN layer having good crystallinity. Thus, by growing AlN crystal at a temperature that is within a range from 1000° C. to 1400° C., it is possible to form an AlN layer having good crystallinity. As a result, when the GaN layer is formed on the AlN layer, GaN crystal is grown with the same crystalline orientation as the AlN layer, so that it is possible to form a [11-20] axial oriented GaN layer having good crystallinity.

Figure 18:
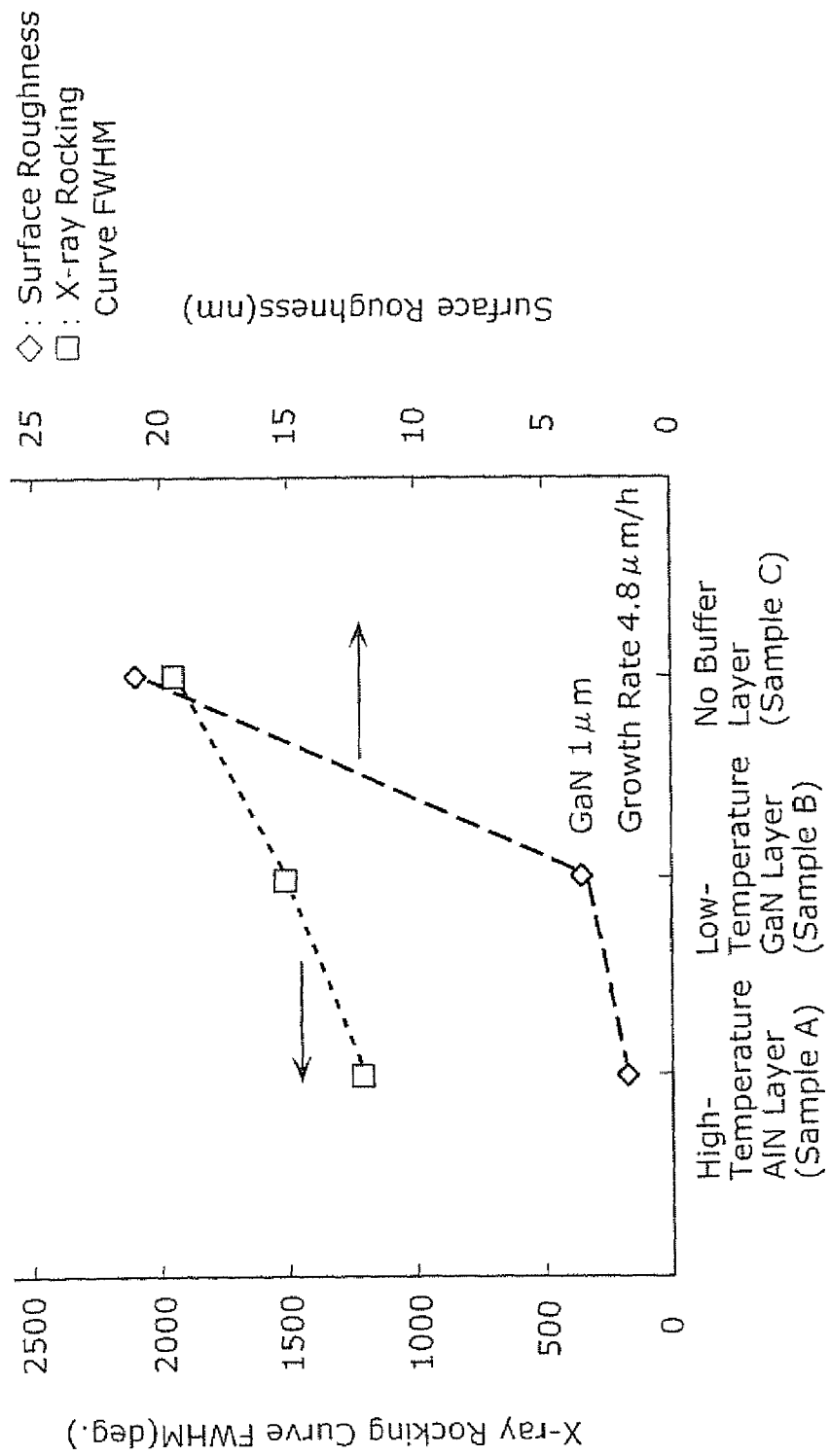
FIG. 18 is a graph showing growth rate dependency of X-ray rocking curve FWHM, and surface roughness observed by an AFM, regarding (11-20) plane of GaN layers in HFET epitaxial layers.

FIG. 18 is a graph showing growth rate dependency of X-ray rocking curve FWHM, and surface roughness observed by an AFM, regarding (11-20) plane of GaN in the following HFET epitaxial layers: a HFET epitaxial layer formed in the growth sequence shown in FIG. 17 (sample A of FIG. 18); a HFET epitaxial layer formed directly on the sapphire substrate without sandwiching the high-temperature AlN buffer layer (sample C of FIG. 18); and a HFET epitaxial layer in which a low-temperature GaN buffer layer is formed at a temperature of about 600° C. instead of the high-temperature AlN buffer layer (sample B of FIG. 18). Here, in each of the HFET epitaxial layers, the GaN layer has a thickness of 1 μm, and formed at a growth rate of 4.8 μm/hour.

As shown in FIG. 18, it is understood that the GaN layer formed above the sapphire substrate sandwiching the buffer layer has better crystallinity, as compared to the GaN layer formed directly on the sapphire substrate without a buffer layer. Furthermore, the GaN layer formed on the high-temperature AlN buffer layer has better crystallinity, as compared to the GaN layer formed on the low-temperature GaN buffer layer. Therefore, in order to form a HFET epitaxial layer in which an A-axial oriented $Al_xGa_{1-x}N$/GaN heterojunction is formed and which has good crystallinity, it is preferable to form the GaN layer by introducing the AlN buffer layer.

Figure 19A:
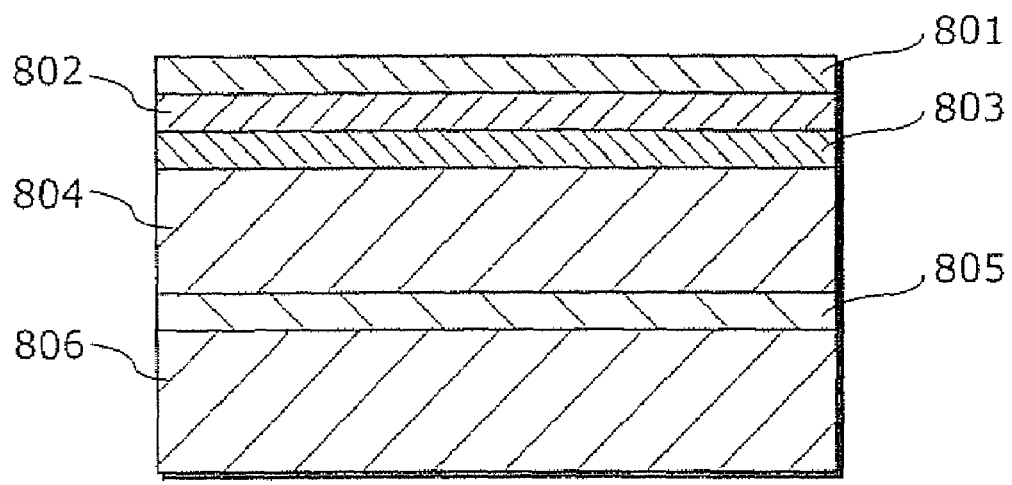
FIG. 19A is a cross-sectional view showing a structure of the HFET epitaxial layer, according to the third embodiment of the present invention.

FIG. 19A is a cross-sectional view showing a structure of the HFET epitaxial layer which is formed in the growth sequence shown in FIG. 17.

This HFET epitaxial layer includes an AlN buffer layer 805, an undoped GaN layer 804, an undoped AlGaN spacer layer 803, an n-type doped AlGaN electron supplying layer 802, and an undoped AlGaN cap layer 801, which are sequentially stacked on R-plane of a sapphire substrate 806.

Here, when a thickness of the AlN buffer layer 805 is less than 500 nm, a lattice strain between the AlN buffer layer 805 and the undoped GaN layer 804 which is stacked on the AlN buffer layer 805 is not appropriately relaxed, which results in generation of squamous morphology or pits on a surface of the epitaxial layer. On the other hand, when a total thickness of the HFET epitaxial layer including the AlN buffer layer 805 on the sapphire substrate 806 is greater than 5 μm, a crack is generated on the surface of the epitaxial layer. Therefore, in order to form a HFET epitaxial layer having good crystallinity, the thickness of the AlN buffer layer 805 is set to 500 nm or more, and a total thickness of the AlN buffer layer 805, the undoped GaN layer 804, the undoped AlGaN spacer layer 803, the n-type doped AlGaN electron supplying layer 802, and the undoped AlGaN cap layer 801 is set to 5 μm or les.

Moreover, when a thickness of the semiconductor layer formed on the sapphire substrate 806, in other words, when a total thickness of the AlN buffer layer 805, the undoped GaN layer 804, the undoped AlGaN spacer layer 803, the n-type doped AlGaN electron supplying layer 802, and the undoped AlGaN cap layer 801, is 2 μm or more, flatness of the HFET epitaxial layer surface is deteriorated, and it becomes difficult to realize that RMS of 10 nm or less. When the RMS is greater than 10 nm, it becomes difficult to form electrodes and an insulating film to be adhered to the semiconductor layers, and also difficult to perform accurate photolithography, so that detectives are easily manufactured and yield is reduced. Therefore, in order to prevent the yield reduction, the total thickness of the AlN buffer layer 805, the undoped GaN layer 804, the undoped AlGaN spacer layer 803, the n-type doped AlGaN electron supplying layer 802, and the undoped AlGaN cap layer 801 is set to be less than 2 μm.

Figure 19B:
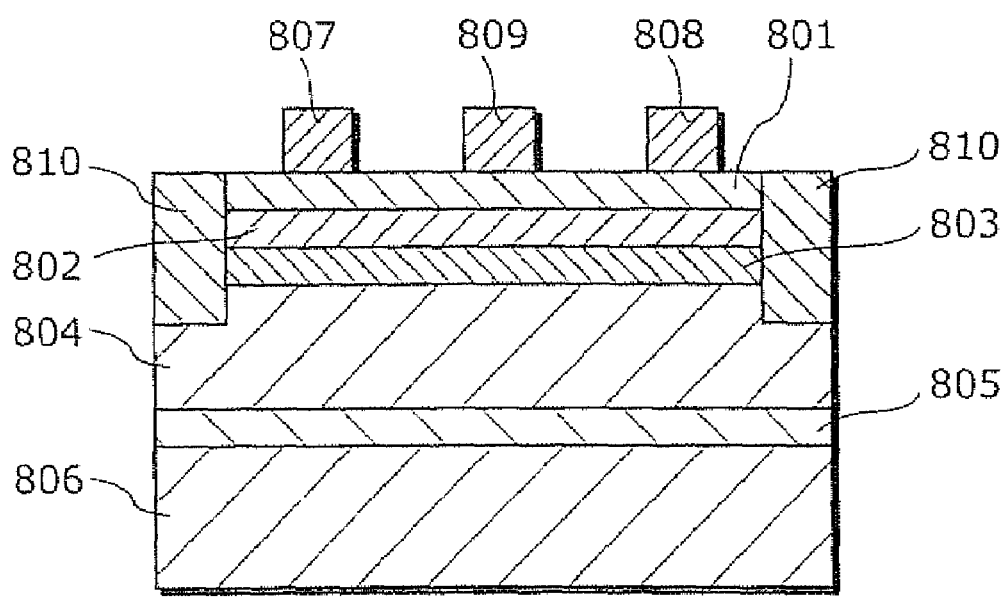
FIG. 19B is a cross-sectional view showing a structure of a HFET formed using the HFET epitaxial layer, according to the third embodiment of the present invention.

To this HFET epitaxial layer, in an oxygen containing atmosphere ($O_2$ or $H_2O$ atmosphere), thermal oxidation is selectively applied in order to form a thermal oxidation layer 810, thereby applying device isolation. After that, on the HFET epitaxial layer, TiAl is formed as a source electrode 807, TiAl is formed as a drain electrode 808, and PdSi as a gate electrode 809 are formed. Then, the HFET epitaxial layer is cleaved. As a result, the HFET shown in FIG. 19B is manufactured. Here, the gate electrode 809 is positioned so that a length direction of the gate electrode 809 becomes parallel to [1-100] axis of GaN.

Although only some exemplary embodiments of the present invention have been described in detail above, those skilled in the art will be readily appreciate that many modifications are possible in the exemplary embodiments without materially departing from the novel teachings and advantages of the present invention. Accordingly, all such modifications are intended to be included within the scope of the present invention.

For example, note that, in the above embodiments, as the semiconductor which is formed on the main surface of the sapphire substrate whose main surface is R-plane, that is (10-12) plane, GaN and $Al_xGa_{1-x}N$ (0<x<1) are used as one example. However, the semiconductor is not limited to the above as far as the semiconductor is a hexagonal crystal III group nitride semiconductor, for example, $In_xAl_yGa_{1-x-y}N$ (0<x<1, 0<y<1). Furthermore, the semiconductor which is formed by crystal growth on the sapphire substrate whose main surface is R-plane, that is (10-12) plane, may be a heterojunction of an $In_xAl_yGa_{1-x-y}N$ (0<x<1, 0<y<1) layer and an $Al_wGa_{1-w}N$ (0≦w<1) layer, or a heterojunction of $In_xAl_yGa_{1-x-y}N$ layers each of which has different composition of x and y.

Note also that, in the above embodiments, the HFET is used as one example of the semiconductor device, but the semiconductor device is not limited to the above. For example, the semiconductor device may be a bipolar transistor, a Schottky barrier diode, or a light emitting device such as a light emitting diode and a semiconductor laser device.

By applying the A-axial orientated GaN layer having good crystallinity to a light emitting device, it is possible to realize a quantum well active layer which is not affected by polarized electric field. When a C-axial oriented GaN layer is applied to a light emitting device, due to electric field generated by polarization, an electron and a hole are accumulated by being distributed spatially, so that a large amount of energy is necessary when the electron and the hole are combined to emit light. On the other hand, when a quantum well is formed on A-plane of the GaN layer, which is a non-polar surface, polarized electric field is not generated, so that it is possible to realize high-efficient light emission in which the electron and the hole are not separated spatially.

Figure 20:
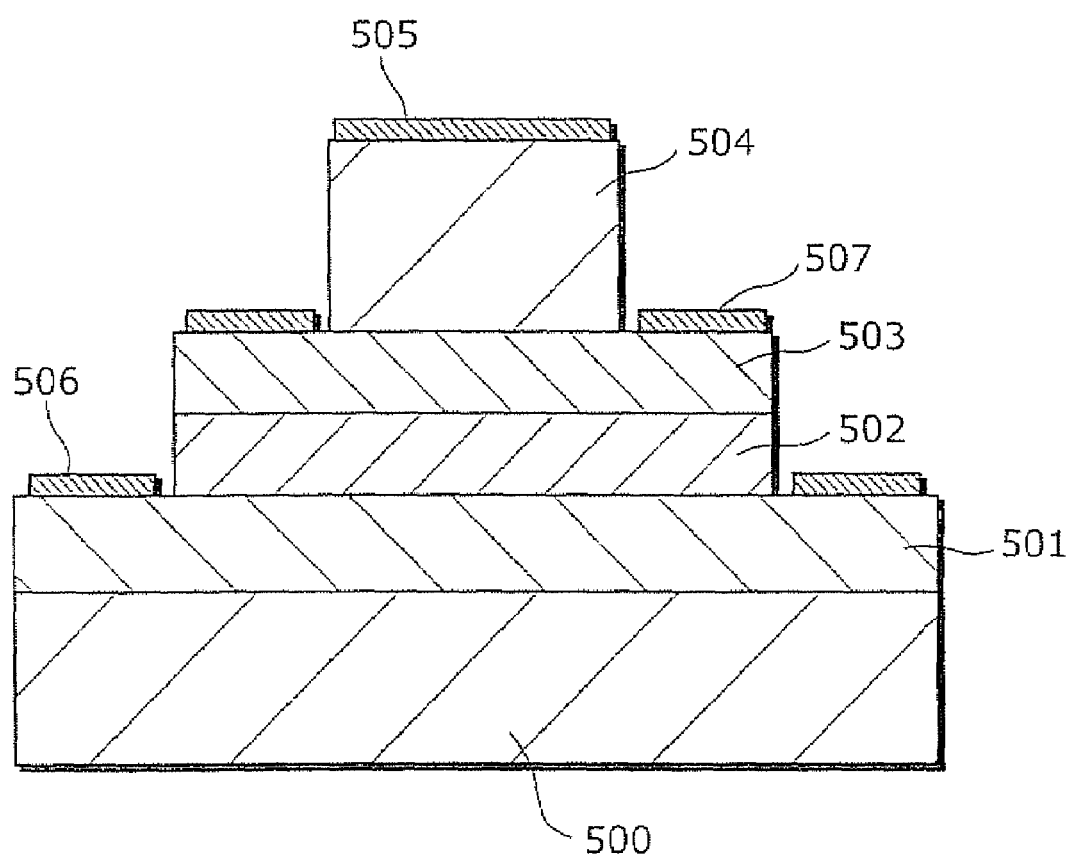
FIG. 20 is a cross-sectional view showing a structure of a bipolar transistor, according to the present invention.

On the other hand, when an A-axial orientated GaN layer having good crystallinity is applied to a bipolar transistor, a bipolar transistor as shown in FIG. 20 is manufactured. More specifically, a bipolar transistor, which has a structure including an $n^+$-type GaN sub-collector layer 501, a GaN collector layer 502, a p-type GaN base layer 503, and an n-type GaN emitter layer 504 sequentially stacked on R-plane of a sapphire substrate 500, is formed. Here, an emitter electrode 505, a collector electrode 506, and a base electrode 507, all of which are ohmic electrodes, are formed on each of the n-type GaN emitter layer 504, the $n^+$-type GaN sub-collector layer 501, and the p-type GaN base layer 503.

Note also that, in the above embodiments, on the sapphire substrate the buffer layer is formed, but the structure is not limited to the above, and the buffer layer may be not necessarily formed.

INDUSTRIAL APPLICABILITY

The present invention is useful for a semiconductor device and a manufacturing method thereof, and especially useful for an electronic device such as a power transistor having a high breakdown voltage, or a light emitting device such as a light emitting diode and a semiconductor laser device.

What is claimed is:

1. A semiconductor device comprising:
   a substrate;
   a semiconductor layer which is on a main surface of said substrate, and made of a III group nitride semiconductor;
   a source electrode on said semiconductor layer; and
   a drain electrode on said semiconductor layer,
   wherein a [11-20] axis of said semiconductor layer is substantially perpendicular to the main surface of said substrate,
   a source-to-drain current flows substantially parallel to a direction of a [0001] axis of said semiconductor layer, and
   said semiconductor device is a field-effect transistor.

2. The semiconductor device according to claim 1, wherein said substrate is a sapphire substrate.

3. The semiconductor device according to claim 1, wherein an X-ray rocking curve full width at half maximum of said semiconductor layer is equal to or less than 2000 arcsec.

4. The semiconductor device according to claim 1, further comprising:
   a buffer layer made of a III group nitride semiconductor;
   wherein said semiconductor layer has a heterojunction of an $Al_wGa_{1-w}N$ (where 0<w<1) layer and a gallium nitride (GaN) layer;
   a thickness of said buffer layer in a direction perpendicular to the main surface of said substrate is equal to or more than 500 nm, and
   a total thickness of said semiconductor layer and said buffer layer in a direction perpendicular to the main surface of said substrate is equal to or less than 5 μm.

5. The semiconductor device according to claim 1, wherein said semiconductor layer has a heterojunction of an $Al_wGa_{1-w}N$ (where 0<w<1) layer and a gallium nitride (GaN) layer, and
a doping concentration of said $Al_wGa_{1-w}N$ layer is $1\times10^{19}$ cm$^{-3}$ or more.

6. The semiconductor device according to claim 1, wherein said semiconductor layer has a heterojunction of an $Al_wGa_{1-w}N$ (where 0<w<1) layer and a gallium nitride (GaN) layer, and
a thickness of said semiconductor layer in a direction perpendicular to the main surface of said substrate is equal to or less than 2 μm.

7. The semiconductor device according to claim 1, further comprising a gate electrode,
wherein a gate length direction of said gate electrode is substantially perpendicular to a direction of a hair-lined morphology formed on the main surface of said semiconductor layer.

8. The semiconductor device according to claim 7,
wherein said semiconductor layer has a heterojunction of an $Al_wGa_{1-w}N$ (where 0<w<1) layer and a gallium nitride (GaN) layer, and
a doping concentration of said $Al_wGa_{1-w}N$ layer is $1\times10^{19}$ cm$^{-3}$ or more.

9. A method of manufacturing a semiconductor device, said method comprising:
placing a substrate;
forming a semiconductor layer made of a III group nitride semiconductor, on a main surface of the substrate;
forming a source electrode on said semiconductor layer; and
forming a drain electrode on said semiconductor layer,
wherein a [11-20] axis of the semiconductor layer is substantially perpendicular to the main surface of the substrate,
a source-to-drain current flows in substantially parallel to a direction of a [0001] axis of said semiconductor layer, and
said semiconductor device is a field-effect transistor.

10. The method according to claim 9 further comprising forming a buffer layer made of gallium nitride (GaN) on the main surface of the substrate,
wherein in said forming of the semiconductor layer, the semiconductor layer is formed, by growing gallium nitride (GaN) crystal on the buffer layer at a rate that is equal to or more than 4 μm/hour.

11. The method according to claim 9, wherein in said forming of the semiconductor layer, the semiconductor layer having a layer made of $In_xAl_yGa_{1-x-y}N$ (where 0≦x<1, 0<y<1) is formed on the main surface of the substrate.

12. The method according to claim 9, wherein the substrate is a sapphire substrate.

13. The method according to claim 9, wherein the semiconductor device is a field-effect transistor, said method further comprising forming a gate electrode on the semiconductor layer.

14. The method according to claim 9, wherein the semiconductor device is a field-effect transistor, said method further comprising forming a gate electrode on the semiconductor layer, wherein a gate length direction of the gate electrode is parallel to a [1-100] axis of the semiconductor layer.

15. The method according to claim 9 further comprising forming a buffer layer on the main surface of the substrate,
wherein in said forming of the semiconductor layer, the semiconductor layer having a heterojunction of an $Al_wGa_{1-w}N$ (where 0<w<1) layer and a gallium nitride GaN layer is formed on the buffer layer.

16. The method according to claim 15,
wherein in said forming of the semiconductor layer, the gallium nitride (GaN) layer is formed, by growing gallium nitride (GaN) crystal on the buffer layer at a temperature that is within a range from 1015° C. to 1045° C.

17. The method according to claim 9 further comprising forming a buffer layer,
wherein in said forming of the semiconductor layer, the semiconductor layer having a layer made of $In_xAl_yGa_{1-x-y}N$ (where 0≦x<1, 0<y<1) is formed on the buffer layer.

18. The method according to claim 17,
wherein in said forming of the buffer layer, the buffer layer made of aluminum nitride (AlN) is formed, by growing aluminum nitride (AlN) crystal on the main surface of the substrate at a temperature that is within a range from 1000° C. to 1400° C.

19. The method according to claim 17,
wherein in said forming of the buffer layer, the buffer layer made of gallium nitride (GaN) is formed, by growing gallium nitride (GaN) crystal on the main surface of the substrate at a temperature that is within a range from 500° C. to 700° C.

* * * * *